(12) United States Patent
Hirade et al.

(10) Patent No.: US 10,714,646 B2
(45) Date of Patent: Jul. 14, 2020

(54) PHOTOELECTRIC CONVERSION MATERIAL CONTAINING ORGANIC SEMICONDUCTOR MATERIAL, AND PHOTOELECTRIC CONVERSION ELEMENT

(71) Applicant: Panasonic Intellectual Property Management Co., Ltd., Osaka (JP)

(72) Inventors: Masaya Hirade, Osaka (JP); Manabu Nakata, Osaka (JP); Yuko Kishimoto, Osaka (JP); Hironori Kaji, Kyoto (JP); Katsuyuki Shizu, Kyoto (JP); Katsuaki Suzuki, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/054,205

(22) Filed: Aug. 3, 2018

(65) Prior Publication Data

US 2019/0051781 A1    Feb. 14, 2019

(30) Foreign Application Priority Data

Aug. 10, 2017    (JP) .................................. 2017-155280

(51) Int. Cl.
*H01L 31/055*    (2014.01)
*H01L 31/0232*   (2014.01)
(Continued)

(52) U.S. Cl.
CPC ............ *H01L 31/055* (2013.01); *C09K 11/06* (2013.01); *H01L 31/02322* (2013.01);
(Continued)

(58) Field of Classification Search
CPC ............. H01L 31/055; H01L 31/02322; H01L 51/006; H01L 51/42; H01L 51/4293; C09K 11/06
See application file for complete search history.

(56) References Cited

U.S. PATENT DOCUMENTS

2006/0027802 A1* 2/2006 Forrest ................... B82Y 10/00
                                                         257/40
2015/0340513 A1* 11/2015 Akimoto ............. H01L 21/0217
                                                         438/104
2015/0340519 A1 11/2015 Rachwal et al.

FOREIGN PATENT DOCUMENTS

JP    2003-234460    8/2003
JP    2015-196659    11/2015
(Continued)

OTHER PUBLICATIONS

Wang et al., Density functional theory design and characterization of D—A—A type electron donors with narrow band gap for small-molecule organic solar cells, Computational and Theoretical Chemistry, vol./Issue 1029, pp. 68-78 (Year: 2014).*
(Continued)

*Primary Examiner* — Jayne L Mershon
(74) *Attorney, Agent, or Firm* — McDermott Will & Emery LLP

(57) ABSTRACT

A photoelectric conversion material includes a compound represented by Formula (1):

(Continued)

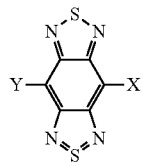

(1)

where, X is selected from the group consisting of a hydrogen atom, a deuterium atom, a halogen atom, an alkyl group, and a cyano group; and Y represents a monovalent substituent represented by Formula (2):

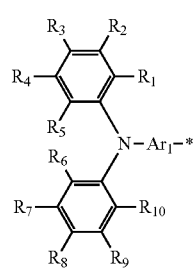

(2)

where, $R_1$ to $R_{10}$ each independently represent a hydrogen atom, a deuterium atom, a halogen atom, an alkyl group, or an aryl group; or two or more of $R_1$ to $R_{10}$ bond to each other to form one or more rings, and the remainders each independently represent a hydrogen atom, a deuterium atom, a halogen atom, an alkyl group, or an aryl group; * denotes the binding site of Y in Formula (1); and $Ar_1$ is selected from the group consisting of structures represented by Formulae (3):

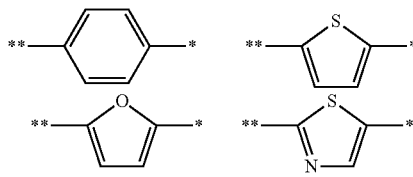

(3)

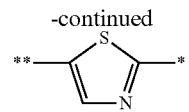

where ** denotes a binding site of $Ar_1$ with N in Formula (2).

2 Claims, 4 Drawing Sheets

(51) Int. Cl.
| | | |
|---|---|---|
| *C09K 11/06* | (2006.01) | |
| *H01L 51/42* | (2006.01) | |
| *H01L 51/00* | (2006.01) | |

(52) U.S. Cl.
CPC ............ *H01L 51/006* (2013.01); *H01L 51/42* (2013.01); *H01L 51/4293* (2013.01)

(56) References Cited

FOREIGN PATENT DOCUMENTS

| JP | 2016-509621 | 3/2016 |
| JP | 2016-134570 | 7/2016 |
| JP | 2017-025039 | 2/2017 |

OTHER PUBLICATIONS

Chen et al., Vacuum-Deposited Small-Molecule Organic Solar Cells with High Power Conversion Efficiencies by Judicious Molecular Design and Device Optimization, Journal of the American Chemical Society, vol./Issue 134, pp. 13616-13623 (Year: 2012).*

Jana Zaumseil et al., "Electron and Ambipolar Transport in Organic Field-Effect Transistors", Chemical Reviews, American Chemical Society, vol. 107, No. 4 (2007), Mar. 23, 2007, pp. 1296-1323.

Serap Gunes et al., "Conjugated Polymer-Based Organic Solar Cells", Chemical Reviews, American Chemical Society, vol. 107, No. 4 (2007), Apr. 11, 2007, pp. 1324-1338.

Gang Qian et al., "Simple and Efficient Near-Infrared Organic Chromophores for Light-Emitting Diodes with Single Electroluminescent Emission above 1000nm", Adv. Mater. 2009, 21, Oct. 30, 2008, pp. 111-116.

* cited by examiner

PHOTOELECTRIC CONVERSION MATERIAL CONTAINING ORGANIC SEMICONDUCTOR MATERIAL, AND PHOTOELECTRIC CONVERSION ELEMENT

BACKGROUND

1. Technical Field

The present disclosure relates to a photoelectric conversion material and a photoelectric conversion element.

2. Description of the Related Art

Organic semiconductor materials have physical properties and functions that are not present in known inorganic semiconductor materials, such as silicon. Accordingly, as described in, for example, JANA ZAUMSEIL et. al., "Electron and Ambipolar Transport in Organic Field-Effect Transistors", Chemical Reviews, American Chemical Society, 2007, Vol. 107, No. 4, pp. 1296-1323 (hereinafter, referred to as NPL 1), organic semiconductor materials have been actively researched in recent years as semiconductor materials that can realize a novel semiconductor device or electronic device.

For example, it has been studied to realize a photoelectric conversion element including a thin film of an organic semiconductor material as a photoelectric conversion material. A photoelectric conversion element including an organic thin film can be used as an organic thin-film solar cell by taking out a carrier, which is a charge generated by light, as energy, as described in, for example, SERAP GUNES et. al., "Conjugated Polymer-Based Organic Solar Cells", Chemical Reviews, American Chemical Society, 2007, Vol. 107, No. 4, pp. 1324-1338 (hereinafter, referred to as NPL 2). Alternatively, for example, as described in Japanese Unexamined Patent Application Publication No. 2003-234460, the photoelectric conversion element can be used as an optical sensor, such as a solid-state image pickup element by taking out a charge generated by light as an electric signal.

In organic semiconductor materials, the energy level can be changed by changing the molecular structure of the organic compound to be used. For example, Japanese Unexamined Patent Application Publication No. 2015-196659 discloses that introduction of a benzo[1,2-c:4,5-c']bis[1,2,5] thiadiazole skeleton as the structural skeleton of a photoelectric conversion material is effective for improving the light-absorption properties in the near infrared region.

SUMMARY

In one general aspect, the techniques disclosed here feature a photoelectric conversion material containing a compound represented by Formula

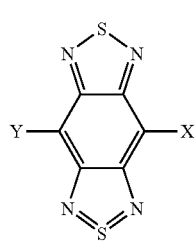

(1)

where, X is selected from the group consisting of a hydrogen atom, a deuterium atom, a halogen atom, an alkyl group, and a cyano group; and Y represents a monovalent substituent represented by Formula (2):

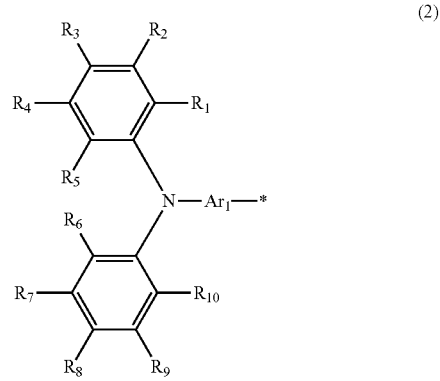

(2)

where, $R_1$, $R_2$, $R_3$, $R_4$, $R_5$, $R_6$, $R_7$, $R_8$, $R_9$, and $R_{10}$ each independently represent a hydrogen atom, a deuterium atom, a halogen atom, an alkyl group, or an aryl group; or two or more of $R_1$, $R_2$, $R_3$, $R_4$, $R_5$, $R_6$, $R_7$, $R_8$, $R_9$, and $R_{10}$ bond to each other to form one or more rings, and the remainders each independently represent a hydrogen atom, a deuterium atom, a halogen atom, an alkyl group, or an aryl group; * denotes a binding site of Y in Formula (1); and $Ar_1$ is selected from the group consisting of structures represented by Formulae (3):

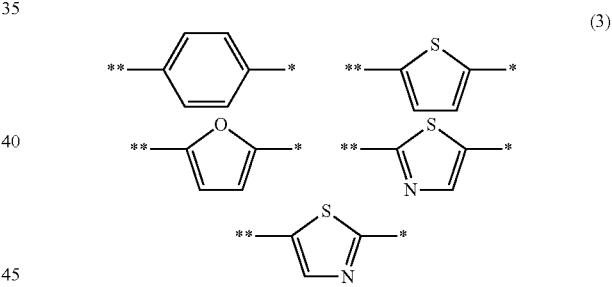

(3)

where, * denotes the binding site of Y in Formula (1); and ** denotes a binding site of $Ar_1$ with N in Formula (2).

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1A:
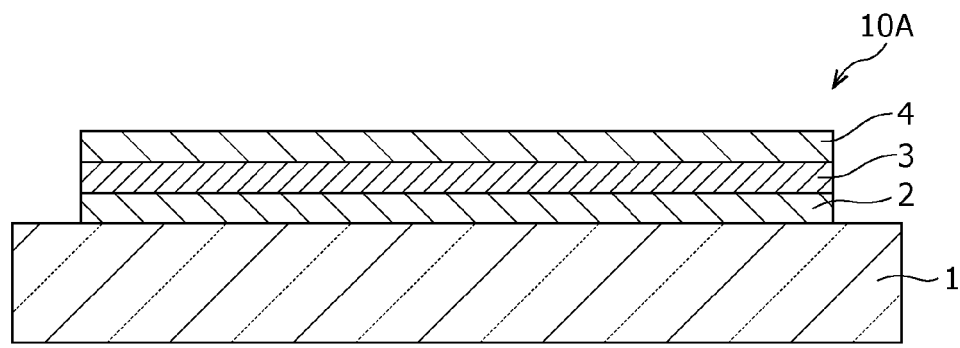
FIG. 1A is a schematic cross-sectional view illustrating an example of the photoelectric conversion element according to an embodiment.

Underlying Knowledge Forming Basis of the Present Disclosure

Organic semiconductor materials have physical properties and functions that are not present in known inorganic semiconductor materials, such as silicon. Accordingly, as described in NPL 1, organic semiconductor materials have been actively researched in recent years as semiconductor materials that can realize a novel semiconductor device or electronic device.

For example, it has been studied to realize a photoelectric conversion element including a thin film of an organic semiconductor material as a photoelectric conversion material. A photoelectric conversion element including an organic thin film can be used as an organic photovoltaic by taking out a carrier, which is a charge generated by light, as energy, as described in, for example, NPL 2. Alternatively, for example, as described in Japanese Unexamined Patent Application Publication No. 2003-234460, the photoelectric conversion element can be used as an optical sensor, such as a solid-state image pickup element by taking out a charge generated by light as an electric signal.

In organic semiconductor materials, the energy level can be changed by changing the molecular structure of the organic compound to be used. Accordingly, for example, in the case of using an organic semiconductor material as a photoelectric conversion material, the absorption wavelength can be controlled to impart sensitivity to silicon (Si) even in the near infrared region where Si does not have sensitivity. That is, the use of an organic semiconductor material allows utilization of light in a wavelength region that has not been used in photoelectric conversion and can achieve solar cells having highly increased efficiency and optical sensors in the near infrared region. Accordingly, in recent years, organic semiconductor materials, photoelectric conversion elements, and image pickup elements having sensitivity in the near infrared region are being actively investigated.

In order to improve the sensitivity in the near infrared region, it is effective to narrow the band gap. An organic semiconductor material can be designed into a structure having an electron donor site (D) and an electron acceptor site (A) in a molecule and can therefore control the absorption wavelength. Japanese Unexamined Patent Application Publication No. 2015-196659 discloses that introduction of a benzo[1,2-c:4,5-c']bis[1,2,5]thiadiazole skeleton as the structural skeleton of a photoelectric conversion material thus having a narrowed band gap is effective.

However, when a benzo[1,2-c:4,5-c']bis[1,2,5]thiadiazole skeleton is introduced into a photoelectric conversion material to shift the absorption wavelength to a longer wavelength, the photoelectric conversion material primarily takes a donor-acceptor-donor (D-A-D) structure in which two donor units having electron-donating properties are bonded to both sides of an acceptor unit having electron-accepting properties. Such a case increases the influence of the donor unit having a high Highest Occupied Molecular Orbital (HOMO) energy level (hereinafter, referred to as HOMO energy level) and raises the HOMO energy level as the whole molecule and readily causes electron transfer. Accordingly, application of a photoelectric conversion material having such a D-A-D structure to a photoelectric conversion element has a risk of leading to an increase in dark current which is a cause of noise.

The present inventors have found application of a donor-acceptor (D-A) structure in which the influence of a donor unit having an effect of raising the HOMO energy level is decreased or an acceptor-donor-acceptor (A-D-A) structure in which the influence of an acceptor unit having an effect of lowering the HOMO energy level is increased to a benzo[1,2-c:4,5-c']bis[1,2,5]thiadiazole skeleton.

Accordingly, the present disclosure provides a photoelectric conversion material having high light-absorption properties in the near infrared region and capable of reducing dark current when formed into an element and provides a photoelectric conversion element.

An outline of one aspect of the present disclosure is as follows.

A photoelectric conversion material according to a first aspect of the present disclosure includes a compound represented by Formula (1):

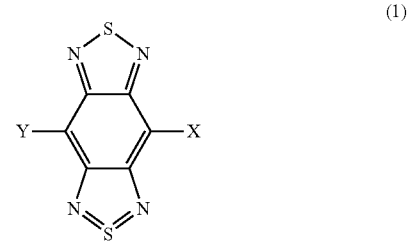

(1)

where

X is selected from the group consisting of a hydrogen atom, a deuterium atom, a halogen atom, an alkyl group, and a cyano group; and Y represents a monovalent substituent represented by Formula (2):

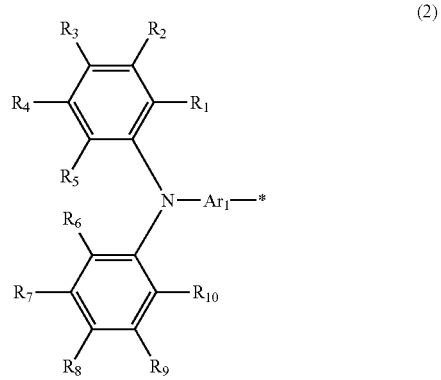

(2)

where $R_1$, $R_2$, $R_3$, $R_4$, $R_5$, $R_6$, $R_7$, $R_8$, $R_9$, and $R_{10}$ each independently represent a hydrogen atom, a deuterium atom, a halogen atom, an alkyl group, or an aryl group; or two or more of $R_1$, $R_2$, $R_3$, $R_4$, $R_5$, $R_6$, $R_7$, $R_8$, $R_9$, and $R_{10}$ bond to each other to form one or more rings, and the remainders each independently represent a hydrogen atom, a deuterium atom, a halogen atom, an alkyl group, or an aryl group;

* denotes a binding site of Y in Formula (1); and $Ar_1$ is selected from the group consisting of structures represented by Formulae (3):

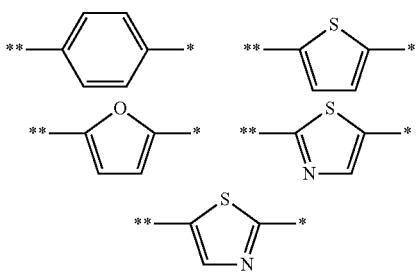

(3)

where

* denotes the binding site of Y in Formula (1); and

** denotes a binding site of $Ar_1$ with N in Formula (2).

Consequently, the photoelectric conversion material according to the first aspect of the present disclosure has a lowered HOMO energy level by including a compound represented by Formula (1). Accordingly, it is possible to reduce the dark current of a photoelectric conversion element by using the photoelectric conversion material according to the first aspect of the present disclosure in the photoelectric conversion film. The compound represented by Formula (1) has a benzo[1,2-c:4,5-c']bis[1,2,5]thiadiazole skeleton and thereby has high light-absorption properties in the near infrared region. Accordingly, a photoelectric conversion element having high light-absorption properties in the near infrared region can be provided by using the photoelectric conversion material according to the first aspect of the present disclosure in the photoelectric conversion film.

A photoelectric conversion material according to a second aspect of the present disclosure includes a compound represented by Formula (4):

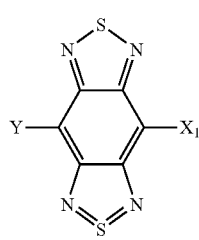

(4)

where $X_1$ is selected from the group consisting of a hydrogen atom, a deuterium atom, a halogen atom, an alkyl group, and a cyano group;

Y represents a monovalent substituent represented by Formula (5):

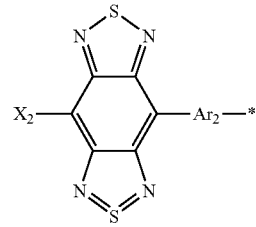

(5)

where $X_2$ is selected from the group consisting of a hydrogen atom, a deuterium atom, a halogen atom, an alkyl group, and a cyano group;

$Ar_2$ represents an aryl group or a heteroaryl group; and

* denotes a binding site of Y in Formula (4).

For example, in the photoelectric conversion material according to the second aspect of the present disclosure, $Ar_2$ in Formula (5) may be selected from the group consisting of structures represented by Formulae (6):

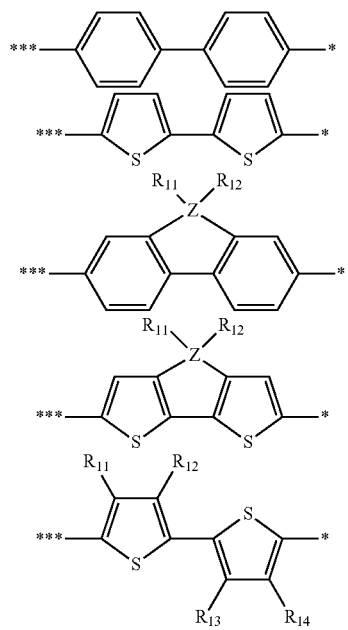

(6)

where $R_{11}$, $R_{12}$, $R_{13}$, and $R_{14}$ each independently represent an alkyl group or an aryl group;

Z represents carbon or silicon;

* denotes the binding site of Y in Formula (4) and one binding site of $Ar_2$ in Formula (5); and

*** denotes the other binding site of $Ar_2$ in Formula (5).

Consequently, the photoelectric conversion material according to the second aspect of the present disclosure includes two benzo[1,2-c:4,5-c']bis[1,2,5]thiadiazole skeletons as the acceptor units in the compound represented by Formula (2) and has a lowered HOMO level. Accordingly, a photoelectric conversion element that can reduce dark current can be provided by using the photoelectric conversion material according to the second aspect of the present disclosure in the photoelectric conversion film. The compound represented by Formula (4) includes a benzo[1,2-c:

4,5-c']bis[1,2,5]thiadiazole skeleton and therefore has high light-absorption properties in the near infrared region. Accordingly, a photoelectric conversion element having high absorption properties in the infrared region can be provided by using the photoelectric conversion material according to the second aspect of the present disclosure in the photoelectric conversion film.

For example, the photoelectric conversion material according to the first or second aspect of the present disclosure may have an ionization potential of higher than 5.2 eV in a solid state.

Consequently, a photoelectric conversion element that can reduce dark current can be provided by using the photoelectric conversion material according to the first or second aspect of the present disclosure in the photoelectric conversion film.

A photoelectric conversion element according to a third aspect of the present disclosure includes a pair of electrodes and a photoelectric conversion layer disposed between the pair of electrodes. The photoelectric conversion layer includes a bulk hetero layer composed of a mixture of an n-type organic semiconductor material and the photoelectric conversion material according to the first or second aspect of the present disclosure. For example, in the photoelectric conversion element according to the third aspect of the present disclosure, the n-type organic semiconductor material may contain at least one selected from the group consisting of fullerene and a fullerene derivative.

Consequently, in the photoelectric conversion element according to the third aspect of the present disclosure, electrons are smoothly transferred between the donor and the acceptor to give a higher photoelectric conversion efficiency.

Embodiments of the present disclosure will now be specifically described with reference to the drawings.

The embodiments described below are all inclusive or specific examples. Numerical values, shapes, components, arrangement positions and connection configurations of the components, steps, the order of the steps, etc. shown in the following embodiments are merely examples and are not intended to limit the present disclosure. Among the components in the following embodiments, components not described in an independent claim showing the broadest concept are described as optional components. Each figure is not necessarily strictly illustrated. In each figure, substantially the same structures are denoted by the same reference signs, and the overlapping explanations may be omitted or simplified.

EMBODIMENT

An embodiment of the photoelectric conversion material and the photoelectric conversion element according to the present disclosure will now be described.

Photoelectric Conversion Material

A photoelectric conversion material according to the embodiment will be described.

The photoelectric conversion material according to the embodiment includes a compound represented by Formula (1). The details of X and Y in Formula (1) will be described below in the paragraphs of "D-A structure" and "A-D-A structure".

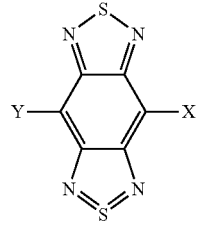

The compound represented by Formula (1) has a benzo [1,2-c:4,5-c']bis[1,2,5]thiadiazole skeleton. The compound has high light-absorption properties in the near infrared region by having the benzo[1,2-c:4,5-c']bis[1,2,5]thiadiazole skeleton.

In the photoelectric conversion material according to the embodiment, the benzo[1,2-c:4,5-c']bis[1,2,5]thiadiazole skeleton and X of the compound function as an acceptor unit (A) having electron-accepting properties. The acceptor unit lowers the HOMO energy level of the compound.

In the photoelectric conversion material according to the embodiment, Y of the compound functions as a donor unit (D) having electron-donating properties. The donor unit raises the HOMO energy level of the compound.

In the case of performing photoelectric conversion in the near infrared region, dark current in the photoelectric conversion element can be decreased by lowering the HOMO energy level of the photoelectric conversion film. The photoelectric conversion material according to the embodiment has two structures in which the donor units (D) and the acceptor units (A) are bound as described below and thereby has high light-absorption properties in the near infrared region and can lower the HOMO energy level. One is a D-A structure that reduces the influence of the donor unit raising the HOMO energy level. The other is an A-D-A structure that increases the influence of the acceptor unit lowering the HOMO energy level.

The photoelectric conversion material according to the embodiment will now be described based on the structure. In the photoelectric conversion material according to the embodiment, Y in Formula (1) is a donor unit, and the benzo[1,2-c:4,5-c']bis[1,2,5]thiadiazole skeleton and X are acceptor units.

The photoelectric conversion material according to the embodiment may contain inevitable impurities, such as starting materials, intermediates, and solvents, in addition to the compound represented by Formula (1).

D-A Structure

A photoelectric conversion material having a D-A structure will be described.

The photoelectric conversion material according to the embodiment contains a compound represented by Formula (1):

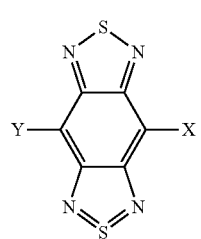

where X is selected from the group consisting of a hydrogen atom, a deuterium atom, a halogen atom, an alkyl group, and a cyano group; and Y represents a monovalent substituent represented by Formula (2).

As described above, the benzo[1,2-c:4,5-c']bis[1,2,5]thiadiazole skeleton and X in the compound function as an acceptor unit having electron-accepting properties. Accordingly, in Formula (1), X preferably represents a hydrogen atom, a deuterium atom, a halogen atom, or an alkyl group having neutral properties or a cyano group having electron-withdrawing properties.

Herein, the alkyl group is, for example, a saturated aliphatic hydrocarbon group, such as a methyl group, an ethyl group, a propyl group, a butyl group, a pentyl group, a hexyl group, a heptyl group, an octyl group, a nonyl group, a decyl group, an undecyl group, or a dodecyl group, and may be linear, branched, or cyclic and may be substituted or unsubstituted. Examples of the linear or branched alkyl group include a methyl group, an ethyl group, a propyl group, an isopropyl group, an n-butyl group, an isobutyl group, a sec-butyl group, a tert-butyl group, an n-pentyl group, an n-hexyl group, an n-heptyl group, and an n-octyl group. Examples of the cyclic alkyl group, i.e., cycloalkyl group, include a cyclopropyl group, a cyclobutyl group, a cyclopentyl group, a cyclohexyl group, a 1-adamantyl group, a 2-adamantyl group, a 1-norbornyl group, and a 2-norbornyl group. Examples of the substituent of the substituted group include alkoxy groups, aryl groups, heteroaryl groups, and halogen atoms mentioned below. The number carbon atoms of the alkyl group may be one or more and may be six or less, from the viewpoint of improvement in sublimability. In particular, the alkyl group may be an alkyl group having one carbon atom, i.e., a methyl group.

The alkoxy group is an aliphatic hydrocarbon group having an ether bond, such as a methoxy group, an ethoxy group, a propoxy group, and a butoxy group. The aliphatic hydrocarbon group may be substituted or unsubstituted. The number of carbon atoms of the alkoxy group is the same as that of the alkyl group. Examples of the substituent of the substituted group include aryl groups, heteroaryl groups, and halogen atoms mentioned below.

The aryl group is an aromatic hydrocarbon group, such as a phenyl group, a naphthyl group, a biphenyl group, a phenanthryl group, an anthryl group, a terphenyl group, a pyrenyl group, a fluorenyl group, and a perylenyl group and may be substituted or unsubstituted. The number of carbon atoms of the aryl group may be four or more and may be 12 or less from the viewpoint of sublimability. Examples of the substituent of the substituted group include the alkyl groups mentioned above and heteroaryl groups and halogen atoms mentioned below.

The heteroaryl group is a hetero aromatic ring group including an atom other than carbon, such as a thienyl group, a furyl group, a pyrrolyl group, an imidazolyl group, a pyrazolyl group, an oxazolyl group, a pyridyl group, a pyrazyl group, a pyrimidyl group, a quinolinyl group, an isoquinolyl group, a quinoxalyl group, an acridinyl group, an indolyl group, a carbazolyl group, a benzofuran group, a dibenzofuran group, a benzothiophene group, a dibenzothiophene group, a benzodithiophene group, a silole group, a benzosilole group, and dibenzosilole group, and may be substituted or unsubstituted. The number of carbon atoms of the heteroaryl group is the same as that of the aryl group. Examples of the substituent of the substituted group include the alkyl groups and aryl groups mentioned above and halogen atoms mentioned below.

The halogen atom is a fluorine atom, a chlorine atom, a bromine atom, or an iodine atom. From the viewpoint of stability, the halogen atom may be a fluorine atom.

Subsequently, Y in the compound will be described. Y represents a monovalent substituent functioning as a donor unit having electron-donating properties and represent a triarylamine represented by Formula (2):

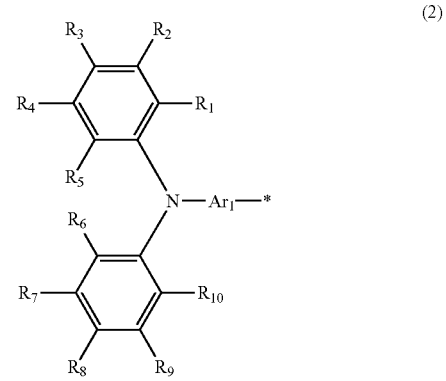

where, $R_1$, $R_2$, $R_3$, $R_4$, $R_5$, $R_6$, $R_7$, $R_8$, $R_9$, and $R_{10}$ each independently represent a hydrogen atom, a deuterium atom, a halogen atom, an alkyl group, or an aryl group; or two or more of $R_1$, $R_2$, $R_3$, $R_4$, $R_5$, $R_6$, $R_7$, $R_8$, $R_9$, and $R_{10}$ (hereinafter, referred to as $R_1$ to $R_{10}$) bond to each other to form one or more rings, and the remainders each independently represent a hydrogen atom, a deuterium atom, a halogen atom, an alkyl group, or an aryl group; and * denotes the binding site of Y in Formula (1).

Herein, the alkyl group may be linear, branched, or cyclic and may be substituted or unsubstituted. Examples of the substituent include alkoxy groups, aryl groups, heteroaryl groups, and halogen atoms. The number of carbon atoms of the alkyl group may be one or more and may be six or less from the viewpoint of improvement in sublimability.

The aryl group may be substituted or unsubstituted. The number of carbon atoms of the aryl group may be four or more and may be 12 or less from the viewpoint of improvement in sublimability. Examples of the substituent include alkyl groups, heteroaryl groups, and halogen atoms.

Two or more of $R_1$ to $R_{10}$ may bond to each other or be fused to form one or more rings.

Examples of the structure of Y include the followings. In Formula (2), $R_1$ to $R_{10}$ may each independently represent a hydrogen atom, an alkyl group, or an alkoxy group from the viewpoints of stability and ease of synthesis; or two or more of $R_1$ to $R_{10}$ may form one or more rings, and the remainders may each independently represent a hydrogen atom, an alkyl group, or an alkoxy group. Specifically, examples of the structure of Y include the followings:

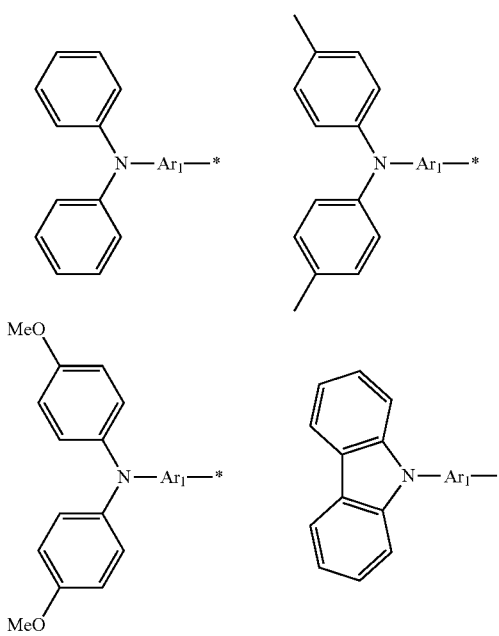

where Ar₁ is selected from the group consisting of the structures represented by Formulae (3):

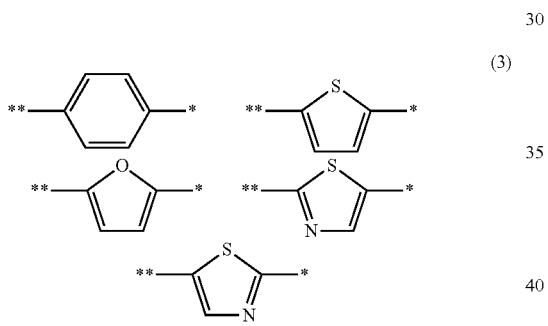

(3)

where * denotes the binding site of Y in Formula (1); and ** denotes the binding site with N in Formula (2).

As described above, Ar₁ is selected from aryl groups and heteroaryl groups having electron-donating properties. The aryl group and the heteroaryl group are the same as those mentioned in the description of Formula (1).

The compound represented by Formula (1) having the D-A structure has, for example, the following structures:

Compound 1

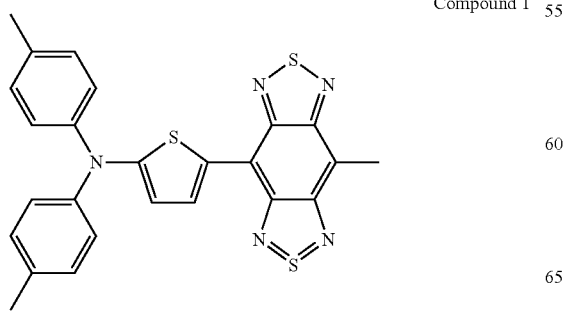

Compound 2

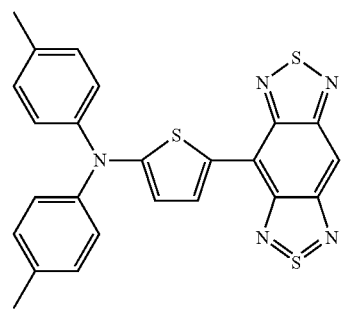 [SMILES: Cc1ccc(N(c2ccc(C)cc2)c2ccc(-c3c4c(cc5nsnc35)N=S=N4)s2)cc1]

Compound 3

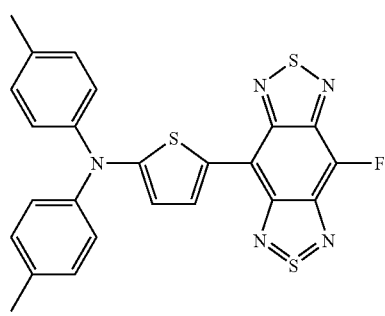 [SMILES: Cc1ccc(N(c2ccc(C)cc2)c2ccc(-c3c4c(c(F)c5nsnc35)N=S=N4)s2)cc1]

Compound 4

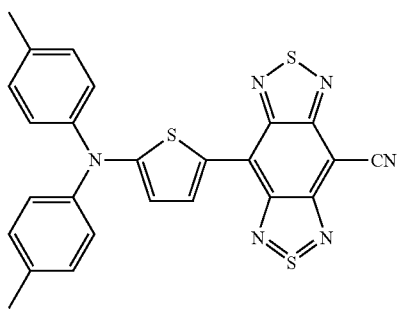 [SMILES: Cc1ccc(N(c2ccc(C)cc2)c2ccc(-c3c4c(c(C#N)c5nsnc35)N=S=N4)s2)cc1]

Compound 5

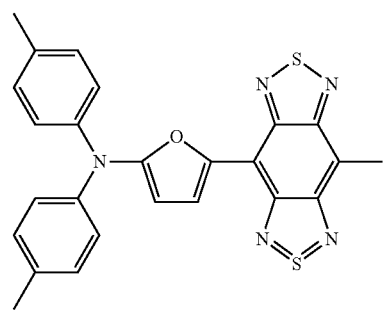

Compound 6

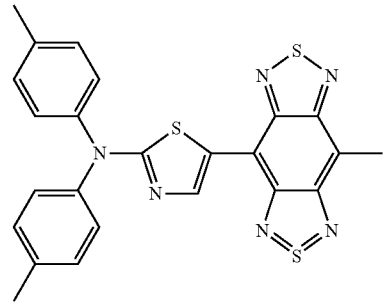

Compound 7

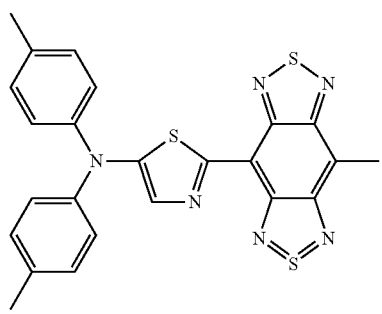

Compound 8

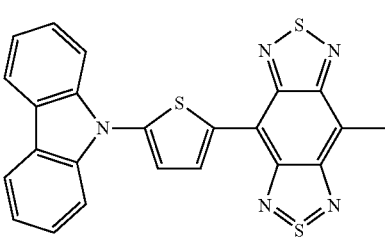 [SMILES: Cc1c2c(c(-c3ccc(-n4c5ccccc5c5ccccc54)s3)c3nsnc13)N=S=N2]

Compound 9

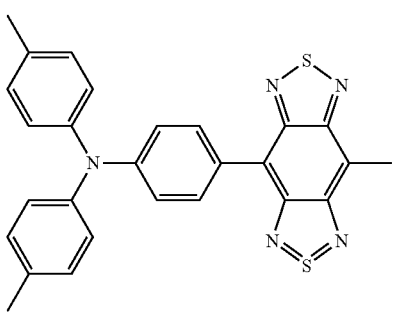 [SMILES: Cc1ccc(N(c2ccc(C)cc2)c2ccc(-c3c4c(c(C)c5nsnc35)N=S=N4)cc2)cc1]

As described above, the photoelectric conversion material according to the embodiment has a lowered HOMO energy level by having a D-A structure that decreases the influence of the donor unit raising the HOMO energy level. Accordingly, a photoelectric conversion element that can reduce dark current can be provided by using the photoelectric conversion material according to the embodiment in the photoelectric conversion film. The compound represented by Formula (1) contained in the photoelectric conversion material according to the embodiment has a benzo[1,2-c:4,5-c']bis[1,2,5]thiadiazole skeleton and therefore has high light-absorption properties in the near infrared region. Accordingly, a photoelectric conversion element having high light-absorption properties in the near infrared region can be provided by using the photoelectric conversion material according to the embodiment in the photoelectric conversion film.

A-D-A Structure

A photoelectric conversion material having an A-D-A structure will now be described.

The photoelectric conversion material according to the embodiment includes a compound represented by Formula (4):

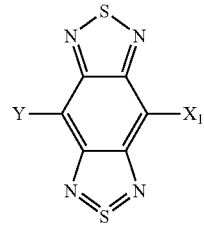

(4)

where, $X_1$ is selected from the group consisting of a hydrogen atom, a deuterium atom, a halogen atom, an alkyl group, and a cyano group; and Y represents a monovalent substituent represented by Formula (5).

As described above, in the compound, the benzo[1,2-c:4,5-c']bis[1,2,5]thiadiazole skeleton and $X_1$ function as an acceptor unit having electron-accepting properties.

Accordingly, in Formula (4), $X_1$ may represent a hydrogen atom, a deuterium atom, a halogen atom, or an alkyl group having neutral properties or a cyano group having electron-withdrawing properties.

Herein, the alkyl group and the halogen atom are the same as those described in the D-A structure.

Subsequently, Y in the compound will be described. Y represents a monovalent substituent represented by Formula (5). Specifically, Y includes a donor unit $Ar_2$ and an acceptor unit composed of a benzo[1,2-c:4,5-c']bis[1,2,5]thiadiazole skeleton and $X_2$. Accordingly, Y functions as a donor-acceptor (D-A) unit.

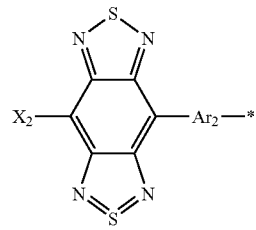

(5)

where, $X_2$ is selected from the group consisting of a hydrogen atom, a deuterium atom, a halogen atom, an alkyl group, and a cyano group; $Ar_2$ represents an aryl group or a heteroaryl group; and * denotes the binding site of Y in Formula (4).

As described above, the benzo[1,2-c:4,5-c']bis[1,2,5]thiadiazole skeleton and $X_2$ in Formula (5) function as an acceptor unit. Accordingly, $X_2$ preferably represents a hydrogen atom, a deuterium atom, a halogen atom, or an alkyl group having neutral properties or a cyano group having electron-withdrawing properties.

Herein, the alkyl group and the halogen atom are the same as those described in the D-A structure.

$Ar_2$ is selected from the group consisting of the structures represented by Formulae (6):

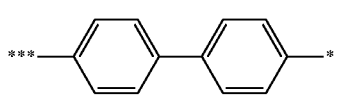

(6)

-continued

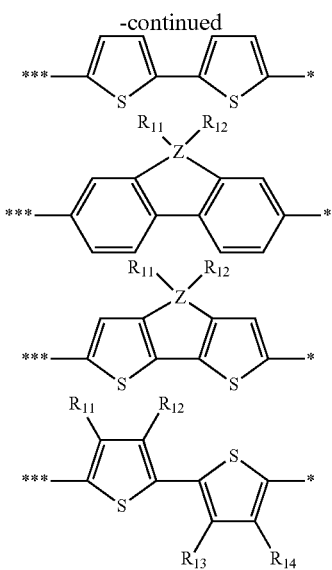

where, $R_{11}$, $R_{12}$, $R_{13}$, and $R_{14}$ each independently represent an alkyl group or an aryl group; Z represents carbon or silicon; * denotes the binding site of Y in Formula (4); and *** denotes the binding site of $Ar_2$ in Formula (5).

As described above, $Ar_2$ functions as a donor unit and is therefore selected from aryl groups and heteroaryl group having electron-donating properties. The aryl groups and the heteroaryl groups are the same as those mentioned in the description of Formula (1).

Examples of the structure of $Ar_2$ include the followings.

(6)

-continued

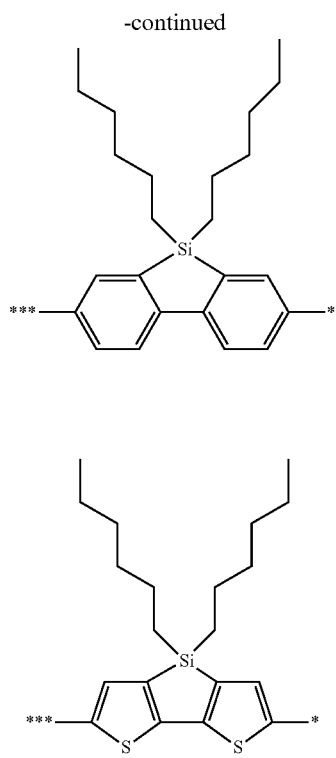

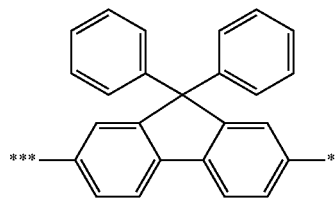

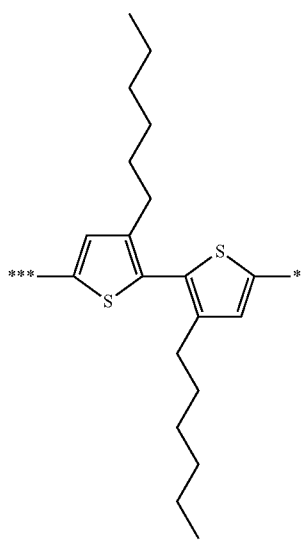

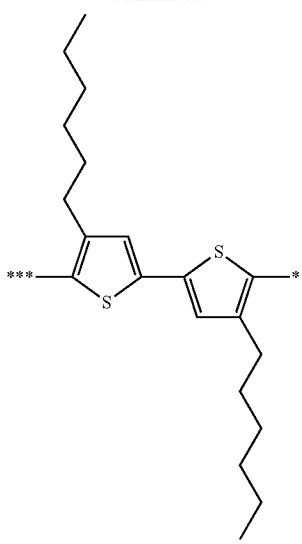
Examples of the structure of the compound having an A-D-A structure and represented by Formula (4) include the followings:
Compound 10
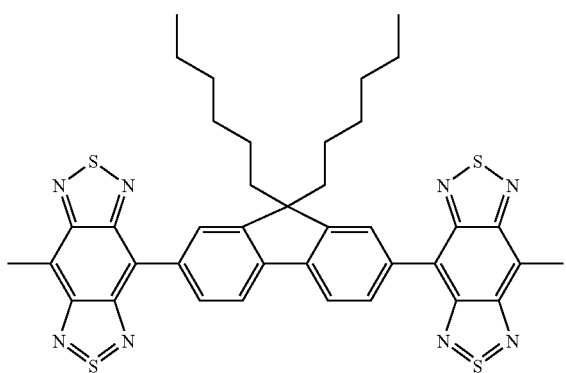
Compound 11
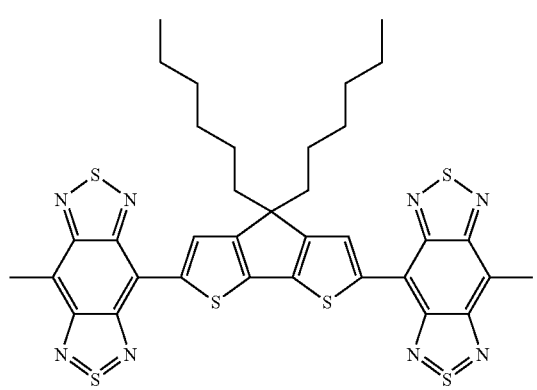
Compound 12
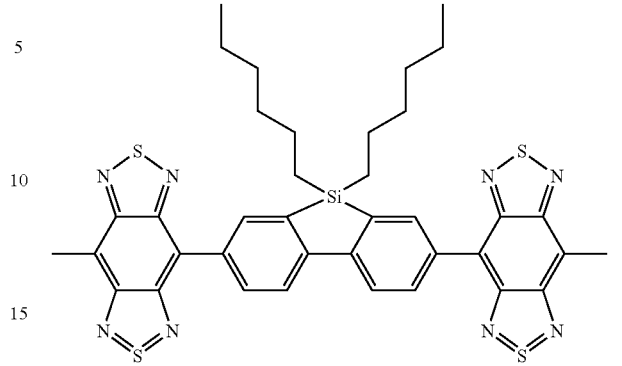
Compound 13
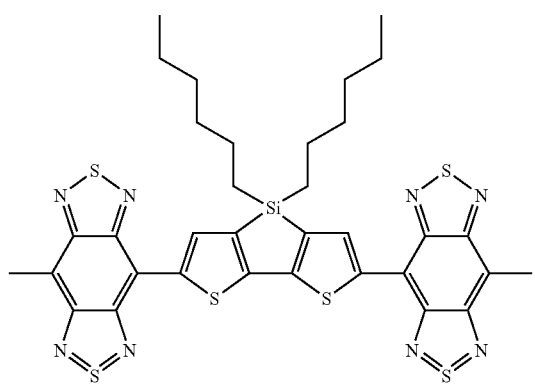
Compound 14
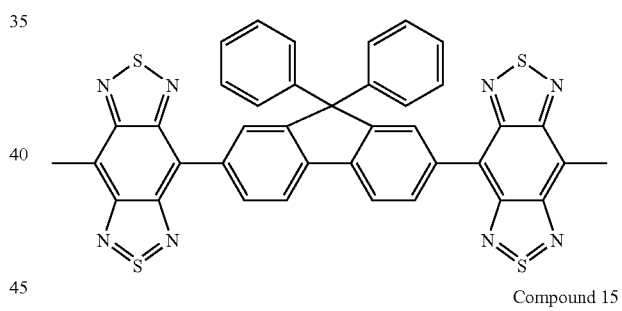
Compound 15
Compound 16
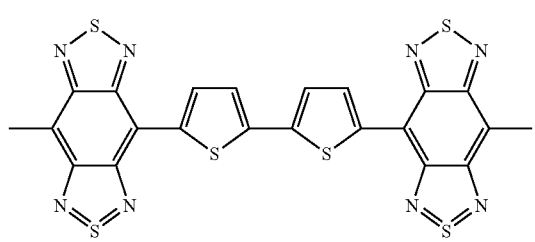

-continued

Compound 17

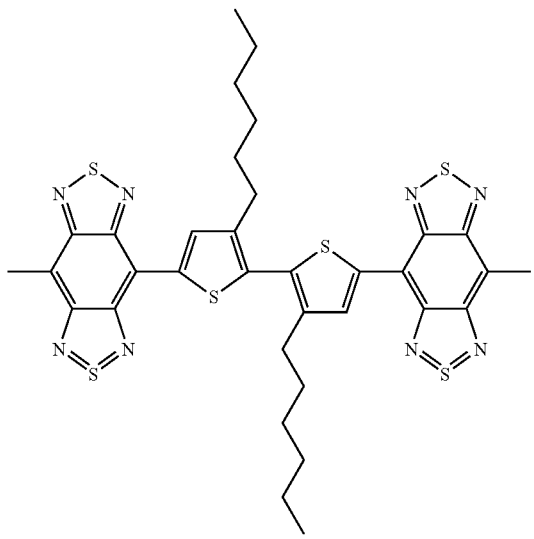

Compound 18

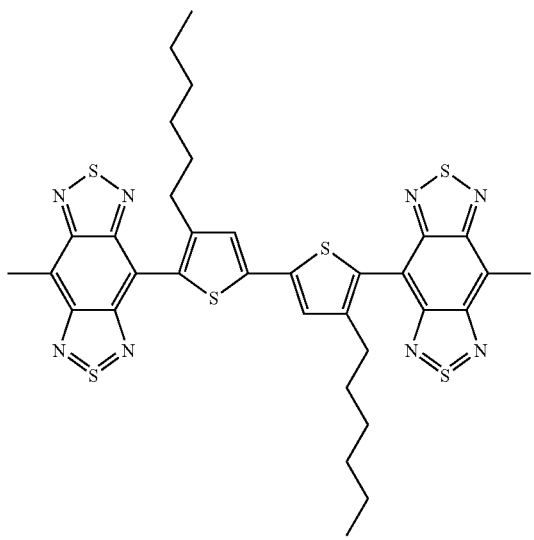

As described above, the photoelectric conversion material according to the embodiment has an A-D-A structure increasing the influence of the acceptor that lowers the HOMO energy level and thereby lowers the HOMO energy level. Accordingly, a photoelectric conversion element that can reduce dark current can be provided by using the photoelectric conversion material according to the embodiment in the photoelectric conversion film. The compound represented by Formula (4) contained in the photoelectric conversion material according to the embodiment has a benzo[1,2-c:4,5-c']bis[1,2,5]thiadiazole skeleton and thereby has high light-absorption properties in the near infrared region. Accordingly, a photoelectric conversion element having high light-absorption properties in the near infrared region can be provided by using the photoelectric conversion material according to the embodiment in the photoelectric conversion film.

Photoelectric Conversion Element

Photoelectric conversion elements according to the embodiment will now be described with reference to FIGS. 1A and 1B. FIG. 1A is a schematic cross-sectional view illustrating an example of a photoelectric conversion element 10A according to the embodiment.

As shown in FIG. 1A, the photoelectric conversion element 10A according to the embodiment includes a bottom electrode 2 and a top electrode 4 as a pair of electrodes and a photoelectric conversion layer disposed between the pair of electrodes. The photoelectric conversion element 10A includes a photoelectric conversion film 3 containing the photoelectric conversion material described above as a photoelectric conversion layer.

The photoelectric conversion element 10A according to the embodiment is supported by, for example a supporting substrate 1. The supporting substrate 1 is transparent for near-infrared light, and light enters the photoelectric conversion element 10A through the supporting substrate 1. The supporting substrate 1 may be any substrate that is used in general photoelectric conversion elements and may be, for example, a glass substrate, a quartz substrate, a semiconductor substrate, or a plastic substrate. The term "transparent for near-infrared light" refers to substantial transparency for near-infrared light. For example, the transmittance of light in the near infrared region is 60% or more or may be 80% or more or 90% or more.

Each component of the photoelectric conversion element 10A according to the embodiment will now be described.

The photoelectric conversion film 3 of the photoelectric conversion element 10A is produced using a photoelectric conversion material containing a compound having a D-A structure or an A-D-A structure described above.

The photoelectric conversion film 3 can be formed by, for example, a coating method, such as spin coating, or a vacuum deposition method in which the material of a film is evaporated by heating in vacuum to deposit it on a substrate. In order to prevent contamination with impurities and to increase the degree of freedom in formation of a multilayer for higher functionality, vapor deposition may be performed. The vapor deposition apparatus may be a commercially available one. The temperature of the vapor deposition source during vapor deposition may be 100° C. to 500° C. or may be 150° C. to 400° C. The degree of vacuum during vapor deposition may be $1 \times 10^{-4}$ Pa to 1 Pa or may be $1 \times 10^{-3}$ Pa to 0.1 Pa. The deposition rate may be increased by adding, for example, metal fine particles to the vapor deposition source.

The mixing ratios of the materials for the photoelectric conversion film 3 are indicated by weight ratios in the coating method and by volume ratios in the vapor deposition. More specifically, in a coating method, the mixing ratio of each material is specified by weight when a solution is prepared. In vapor deposition, the mixing ratio of each material is specified while monitoring the thickness of the vapor deposited film of each material with a film thickness meter during vapor deposition.

The photoelectric conversion film 3 may be a bulk hetero layer in which the above-described photoelectric conversion material and an n-type organic semiconductor are mixed with each other. The photoelectric conversion film 3 may further contain a p-type organic semiconductor. In such a case, the n-type organic semiconductor material may contain at least one selected from the group consisting of fullerene and fullerene derivatives. Consequently, in the photoelectric conversion element 10A according to the embodiment, electrons are smoothly transferred between the donor and the acceptor to give a higher photoelectric conversion efficiency. The n-type organic semiconductor and the p-type organic semiconductor will be described later as an n-type semiconductor of an organic compound and a p-type semiconductor of an organic compound.

When the photoelectric conversion film 3 is thus a bulk hetero layer, the contact area of the p-type semiconductor and the n-type semiconductor can be reduced to prevent dark current. When the bulk hetero layer contains a large amount of an n-type semiconductor, such as a fullerene derivative, from the viewpoint of charge mobility, the element resistance can be suppressed.

At least one of the top electrode 4 and the bottom electrode 2 is a transparent electrode constituted of a conducting material transparent to near-infrared light. The bottom electrode 2 and the top electrode 4 are applied with a bias voltage with wiring (not shown). For example, the polarity of the bias voltage is set such that the electrons in the charge generated in the photoelectric conversion film 3 move to the top electrode 4, and the holes move to the bottom electrode 2. Alternatively, the bias voltage may be set such that the holes in the charge generated in the photoelectric conversion film 3 move to the top electrode 4, and the electrons move to the bottom electrode 2.

The bias voltage may be applied such that the electric field generated in the photoelectric conversion element 10A, i.e., the value obtained by dividing the applied voltage by the distance between the bottom electrode 2 and the top electrode 4, is within a range of $1.0\times10^3$ to $1.0\times10^7$ V/cm or within a range of $1.0\times10^4$ to $1.0\times10^6$ V/cm. The charge can be efficiently transferred to the top electrode 4 and a signal corresponding to the charge can be extracted to the outside by thus adjusting the magnitude of the bias voltage.

The material of each of the bottom electrode 2 and the top electrode 4 may be a transparent conducting oxide (TCO) having a high light transmittance in the near infrared region and a low resistance value. Although a metal thin film of Au or the like may be used as the transparent electrode, the resistance value may significantly increase by increasing the light transmittance to 90% or more in the near infrared region, compared to a case of producing a transparent electrode having a transmittance of 60% to 80%. Accordingly, a transparent electrode having a high transparency to near-infrared light and having a low resistance value can be provided by using TCO instead of a metal material such as Au. Examples of TCO include, but not limited to, indium tin oxide (ITO), indium zinc oxide (IZO), aluminum-doped zinc oxide (AZO), fluorine-doped tin oxide (FTO), $SnO_2$, $TiO_2$, and $ZnO_2$. The bottom electrode 2 and the top electrode 4 may be each appropriately made of TCO or a metal material such as Au alone or a combination thereof.

The materials of the bottom electrode 2 and the top electrode 4 are not limited to the above-mentioned conducting materials transparence to near-infrared light and may be other materials.

The bottom electrode 2 and the top electrode 4 can be produced by a variety of methods depending on the materials. For example, in the case of using ITO, an electron beam method, a sputtering method, a resistance heating vapor deposition method, a chemical reaction method such as a sol-gel method, or coating of a dispersion of indium tin oxide may be used. In this case, the formed ITO film may be further subjected to treatment, such as UV-ozone treatment or plasma treatment.

In the photoelectric conversion element 10A, photoelectric conversion is caused by near-infrared light incident on the photoelectric conversion film 3 through the supporting substrate 1 and bottom electrode 2. The holes of the generated electron-hole pairs are collected in the bottom electrode 2, and the electrons are collected in the top electrode 4.

Accordingly, for example, near-infrared light incident on the photoelectric conversion element 10A can be detected by measuring the potential of the bottom electrode 2.

The photoelectric conversion element 10A may further include an electron-blocking layer 5 and a hole-blocking layer 6 described below. When the photoelectric conversion film 3 is disposed between the electron-blocking layer 5 and the hole-blocking layer 6, injection of electrons from the bottom electrode 2 to the photoelectric conversion film 3 and injection of holes from the top electrode 4 to the photoelectric conversion film 3 can be prevented. Consequently, dark current can be suppressed. The details of the electron-blocking layer 5 and the hole-blocking layer 6 will be described later, so the explanation here is omitted.

Subsequently, another example of the photoelectric conversion element according to the embodiment will be described. FIG. 1B is a schematic cross-sectional view illustrating a photoelectric conversion element 10B, another example of the photoelectric conversion element according to the embodiment.

Figure 1B:
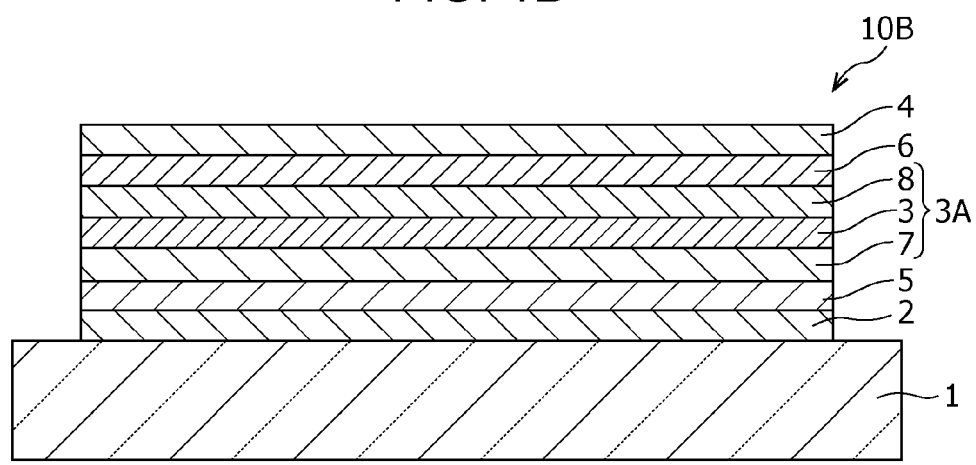
FIG. 1B is a schematic cross-sectional view illustrating another example of the photoelectric conversion element according to an embodiment.

The same components of the photoelectric conversion element 10B shown in FIG. 1B as those of the photoelectric conversion element 10A shown in FIG. 1A are denoted with the same reference numerals.

As shown in FIG. 1B, the photoelectric conversion element 10B according to the embodiment includes a bottom electrode 2 and a top electrode 4 as a pair of electrodes and a photoelectric conversion layer 3A disposed between the pair of electrodes. The photoelectric conversion layer 3A includes a photoelectric conversion film 3, a p-type semiconductor layer 7 functioning as a hole-transporting layer, and an n-type semiconductor layer 8 functioning as an electron-transporting layer. The photoelectric conversion film 3 is arranged between the p-type semiconductor layer 7 and the n-type semiconductor layer 8. The photoelectric conversion element 10B further includes an electron-blocking layer 5 arranged between the bottom electrode 2 and the photoelectric conversion layer 3A and a hole-blocking layer 6 arranged between the top electrode 4 and the photoelectric conversion layer 3A. The photoelectric conversion film 3 is the same as that described in the photoelectric conversion element 10A, so the explanation here is omitted.

The photoelectric conversion layer 3A includes the photoelectric conversion film 3, the p-type semiconductor layer 7, and the n-type semiconductor layer 8. Here, at least one of the p-type semiconductor contained in the p-type semiconductor layer 7 and the n-type semiconductor contained in the n-type semiconductor layer 8 may be an organic semiconductor described below.

The photoelectric conversion layer 3A may contain the photoelectric conversion material described above and at least one of a p-type organic semiconductor and an n-type organic semiconductor.

The photoelectric conversion layer 3A may include a bulk hetero layer composed of a mixture of a p-type semiconductor and an n-type semiconductor. In such a case, the p-type semiconductor may be the photoelectric conversion material mentioned above or may be the photoelectric conversion material and another p-type organic semiconductor material. Thus, the photoelectric conversion layer 3A compensates for a disadvantage, the short carrier diffusion length in the photoelectric conversion layer 3A, by including a bulk hetero layer and can improve the photoelectric conversion efficiency.

In the photoelectric conversion layer 3A, the bulk hetero layer may be arranged between the p-type semiconductor layer 7 and the n-type semiconductor layer 8. When the bulk hetero layer is disposed between the p-type semiconductor layer 7 and the n-type semiconductor layer 8, the rectification of electrons and holes is higher than that by the bulk hetero layer to reduce the loss due to, for example, recombination of charge isolated electrons and holes, resulting in a high photoelectric conversion ratio.

In the bulk hetero layer, the p-type semiconductor and the n-type semiconductor are in contact with each other, which may cause occurrence of a charge even in dark conditions. Accordingly, the dark current can be suppressed by reducing the contact area between the p-type semiconductor and the n-type semiconductor. When the bulk hetero layer contains a large amount of an n-type semiconductor, such as a fullerene derivative, from the viewpoint of charge mobility, the element resistance can be suppressed.

The photoelectric conversion film 3 may contain the above-described photoelectric conversion material and at least one of a p-type organic semiconductor and an n-type organic semiconductor.

The p-type organic semiconductor and the n-type organic semiconductor will now be specifically exemplified.

The p-type organic semiconductor, i.e., a p-type semiconductor of an organic compound is a donor organic semiconductor and is mainly represented by a hole-transporting organic compound having electron donating properties. More specifically, the p-type organic semiconductor is an organic compound having a smaller ionization potential between two organic materials being in contact with each other. Accordingly, the donor organic semiconductor may be any organic compound having electron-donating properties. Examples of the donor organic semiconductor include triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, condensed aromatic carbocyclic compounds (naphthalene derivatives, anthracene derivatives, phenanthrene derivatives, tetracene derivatives, pyrene derivatives, perylene derivatives, and fluoranthene derivatives), and metal complexes having nitrogen-containing heterocyclic compounds as ligands. The donor organic semiconductor is not limited to these compounds, and any organic compound having an ionization potential lower than that of the organic compound used as an acceptor organic semiconductor may be used as the donor organic semiconductor, as described above.

The n-type organic semiconductor, i.e., an n-type semiconductor of an organic compound is an acceptor organic semiconductor and is mainly represented by an electron-transporting organic compound having electron accepting properties. More specifically, the n-type organic semiconductor is an organic compound having a higher electron affinity between two organic materials being in contact with each other. Accordingly, the acceptor organic compound may be any organic compound having electron-accepting properties. Examples of the acceptor organic compound include fullerene, fullerene derivatives, condensed aromatic carbocyclic compounds (naphthalene derivatives, anthracene derivatives, phenanthrene derivatives, tetracene derivatives, pyrene derivatives, perylene derivatives, and fluoranthene derivatives), nitrogen, oxygen, or sulfur-containing five- to seven-membered heterocyclic compounds (e.g., pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyrrolidine, pyrrolopyridine, thiadiazolopyridine, dibenzazepine, and tribenzazepine), polyarylene compounds, fluorene compounds, cyclopentadiene compounds, silyl compounds, and metal complexes having nitrogen-containing heterocyclic compounds as ligands. The acceptor organic semiconductor is not limited to these compounds, and any organic compound having an electron affinity higher than that of the organic compound used as a donor organic compound may be used as the acceptor organic semiconductor, as described above.

In the photoelectric conversion element 10B according to the embodiment, the n-type organic semiconductor material may contain at least one selected from the group consisting of fullerene and fullerene derivatives. Consequently, in the photoelectric conversion element 10B according to the embodiment, electrons are smoothly transferred between the donor and the acceptor to give a higher photoelectric conversion efficiency.

Figure 2:
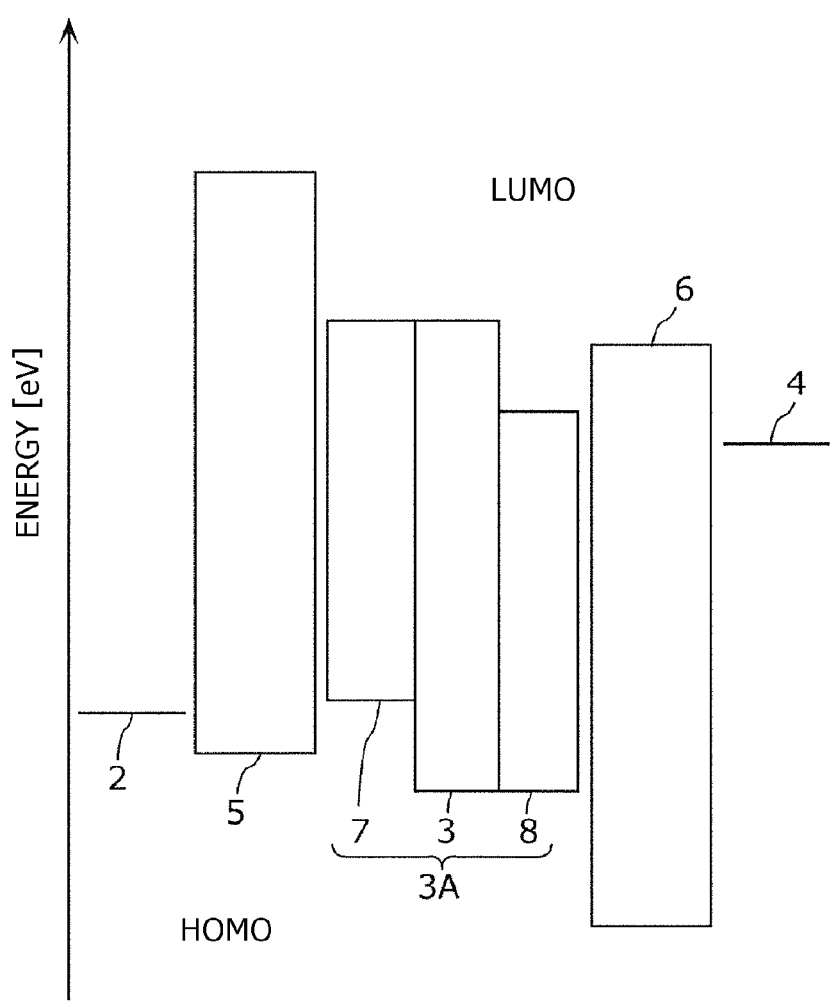
FIG. 2 is an exemplary energy band diagram of the photoelectric conversion element shown in FIG. 1B.

FIG. 2 shows an example of a schematic energy band of the photoelectric conversion element 10B having the structure shown in FIG. 1B.

In the photoelectric conversion element 10B, the electron-blocking layer 5 has a HOMO energy level lower than that of the p-type semiconductor layer 7. In the photoelectric conversion element 10B, the hole-blocking layer 6 has a Lowest Unoccupied Molecular Orbital (LUMO) energy level higher than that of the n-type semiconductor layer 8.

The electron-blocking layer 5 reduces the dark current caused by injection of electrons from the bottom electrode 2 and prevents electrons to be injected into the photoelectric conversion layer 3A from the bottom electrode 2. The electron-blocking layer 5 may be composed of the above-described p-type semiconductor or a hole-transporting organic compound. As shown in FIG. 2, electron-blocking layer 5 has a low HOMO energy level and a high LUMO energy level compared to the p-type semiconductor layer 7 of the photoelectric conversion layer 3A. In other words, the photoelectric conversion layer 3A near the interface with the electron-blocking layer 5 has a higher HOMO energy level and a lower LUMO energy level than those of the electron-blocking layer 5. The electron-blocking layer 5 may be composed of the above-described p-type semiconductor or a hole-transporting organic compound.

The hole-blocking layer 6 reduces the dark current caused by injection of holes from the top electrode 4 and prevents holes from being injected into the photoelectric conversion layer 3A from the top electrode 4. The material of the hole-blocking layer 6 may be, for example, an organic material, such as copper phthalocyanine, perylene tetracarboxylic dianhydride (PTCDA), an acetylacetonate complex, bathocuproine (BCP), or tris(8-quinolinolato)aluminum (Ill) (Alq); an organic metal compound; or an inorganic material, such as MgAg or MgO. The hole-blocking layer 6 may have a high near-infrared light transmittance in order not to prevent the light absorption by the photoelectric conversion film 3A or may be a material not having absorption in the visible region, or the hole-blocking layer 6 may have a small thickness. The thickness of the hole-blocking layer 6 varies depending on, for example, the composition of the photoelectric conversion layer 3A and the thickness of the top electrode 4 and may be, for example, 2 to 50 nm. The hole-blocking layer 6 may be composed of the above-described n-type semiconductor or an electron-transporting organic compound.

When the electron-blocking layer 5 is disposed, the material of the bottom electrode 2 is selected from the above-mentioned materials considering the adhesion with the electron-blocking layer 5, electron affinity, ionization potential, stability, and so on. The material of the top electrode 4 is similarly determined.

As shown in FIG. 2, a relatively high work function of the top electrode 4 (e.g., 4.8 eV) reduces the barrier against movement of holes to the photoelectric conversion film 3 when a bias voltage is applied. It is accordingly presumed that hole injection from the top electrode 4 to the photoelectric conversion layer 3A readily occurs and, as a result, dark current increases. In the embodiment, since the hole-blocking layer 6 is provided, dark current is suppressed.

As described above, the photoelectric conversion element according to the embodiment has high light-absorption properties in the near infrared region by including the above-described photoelectric conversion material to reduce dark current. Accordingly, the embodiment can achieve a photoelectric conversion element, such as an image pickup element, capable of detecting near-infrared light with high precision.

Examples

The photoelectric conversion material and the photoelectric conversion element of the present disclosure will now be specifically described by examples, but the present disclosure is not limited to the following examples.

Photoelectric conversion materials respectively containing compounds prepared in Example 1, Example 2, Example 3, and Comparative Example 1 were formed into photoelectric conversion films of Example 4, Example 5, Example 6, and Comparative Example 2, respectively.

Example 1

Synthesis of Compound 1

Compound 1 represented by the following structural formula was synthesized according to steps (1) to (3) described below. Compound 1 has a D-A structure.

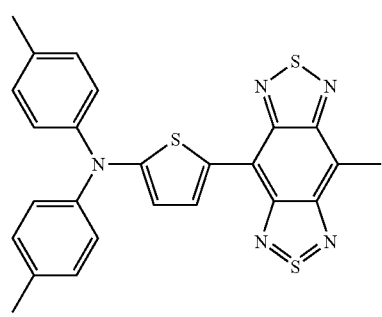

Compound 1

(1) Synthesis of Compound (1-d)

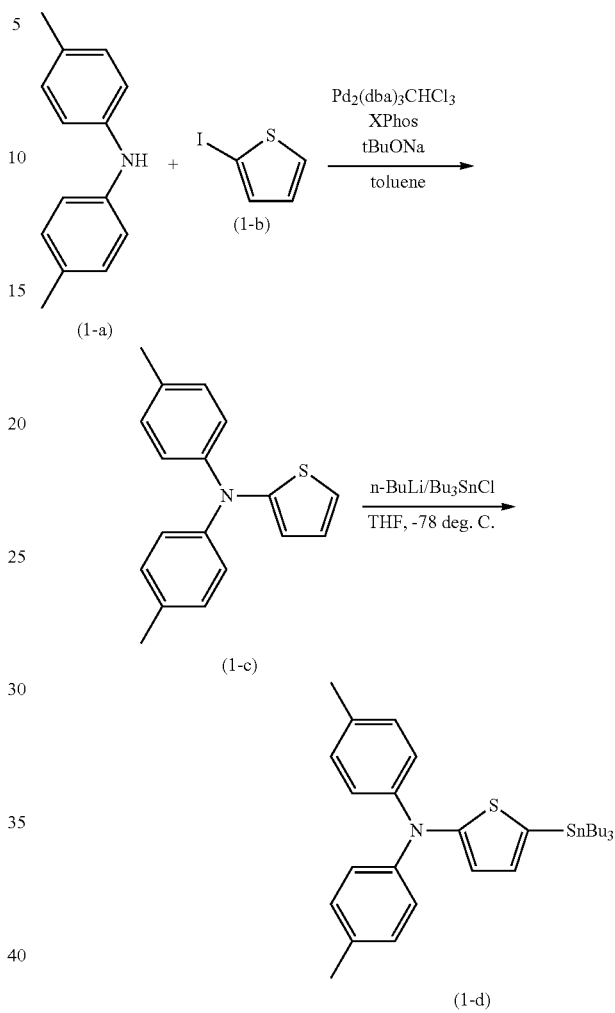

Compound (1-a) (5.9 g, 30 mmol), sodium tert-butoxide (tBuONa, 6.2 g, 66 mmol), tris(dibenzylideneacetone)dipalladium-chloroform adduct ($Pd_2(dba)_3CHCl_3$, 311 mg, 0.3 mmol), 2-dicyclohexylphosphino-2',4',6'-triisopropylbiphenyl (XPhos, 290 mg, 0.6 mmol), and toluene (60 mL) were put in a 100-mL flask equipped with a screw cap and were stirred. Compound (1-b) (3.3 mL, 32 mmol) was further added thereto. The mixture was freeze-deaerated and was then stirred at 110° C. for 48 hours in an argon atmosphere.

After heating, the reaction solution was cooled to room temperature and was filtered through celite, and the resulting filtrate was concentrated under reduced pressure to obtain an oily matter. The resulting oily matter was purified by silica gel column chromatography (eluent: chloroform/hexane=1/1, Rf=0.7) to obtain Compound (1-c) as a yellow oily liquid (amount: 5.5 g, 19.7 mmol, yield: 66%).

Compound (1-c) (1.2 g, 4.3 mmol) and tetrahydrofuran (THF, 20 mL) were put in a 100-mL two-necked flask and were stirred in an argon gas atmosphere, followed by cooling to −78° C. Normal-butyllithium (n-BuLi, 4 mL, 6.5 mmol) was gradually dropwise added to the flask, followed by stirring at −78° C. for 1 hour. Tributyl stannyl chloride ($Bu_3SnCl$, 1.6 mL, 6 mmol) was gradually stepwise added to the flask, and the reaction solution was then warmed to room temperature, followed by stirring overnight. Water (30 mL) was added to the reaction solution, followed by extraction with dichloromethane. The organic layer was dried over sodium sulfate, and the solvent was then removed under reduced pressure for concentration to dryness to obtain Compound (l-d) as a yellow oily liquid (amount: about 2 g).

(2) Synthesis of Compound (1-j)

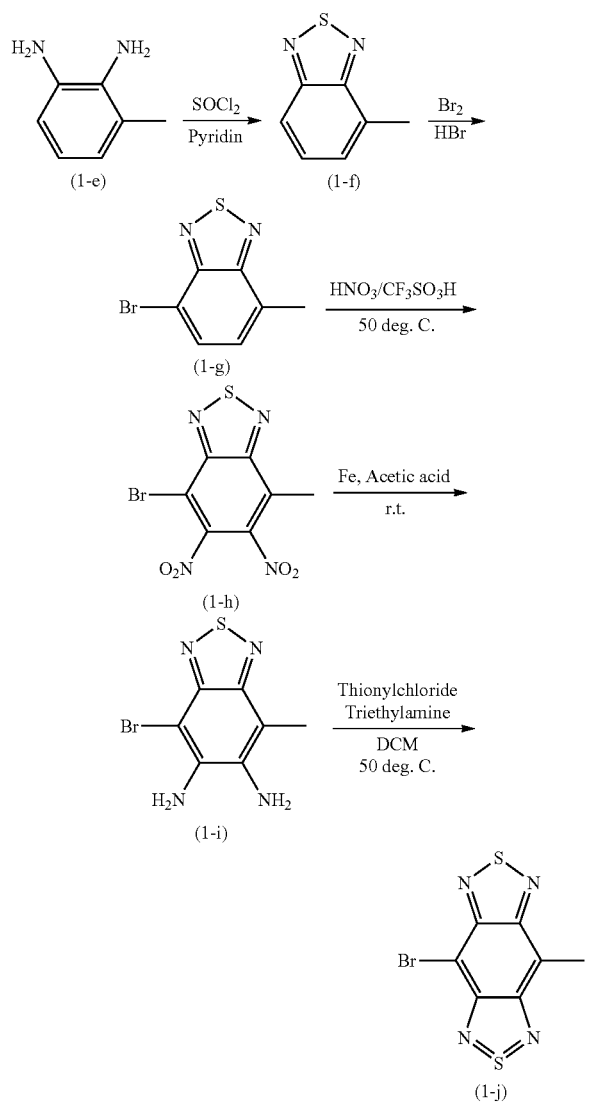

Compound (1-e) (12 g, 98 mmol) and pyridine (100 mL) were put in a 500-mL two-necked flask equipped with a dropping funnel and were stirred in an argon gas atmosphere while ice cooling. Thionyl chloride (16.4 mL, 240 mmol) was gradually dropwise added to the flask such that the solution temperature did not increase above 30° C. Subsequently, concentrated HCl (48 mL) was gradually dropwise added to the flask such that the solution temperature did not increase above 60° C., followed by stirring at room temperature overnight. Water was added to the reaction solution, followed by extraction with ether to obtain Compound (1-f) as a brown oily liquid (amount: 9.3 g, yield: 63%).

Compound (1-f) (9.3 g, 62 mmol) and HBr (65 mL) were put in a 500-mL two-necked flask equipped with a reflux tube and a dropping funnel and were stirred in an argon gas atmosphere. Bromine (10 g, 62.6 mmol) was gradually dropwise added to the resulting reaction solution, and the mixture was stirred at 80° C. for 30 minutes, followed by stirring at 130° C. overnight. Subsequently, the reaction solution was cooled to room temperature and was then neutralized with a saturated $Na_2SO_3$ aqueous solution. The neutralized reaction solution was extracted with dichloromethane, and the organic layer was dried over sodium sulfate and was then concentrated to dryness to obtain Compound (1-g) as a yellow solid (amount: 13.2 g, yield: 92%).

Trifluoromethanesulfonic acid (50 g, 334 mmol) was put in a 100-mL recovery flask, and fuming $HNO_3$ (3.4 mL, 74 mmol) was gradually added to the flask with ice-cooling and stirring. Compound (1-g) (6.60 g, 28 mmol) was gradually added to the resulting solution, followed by stirring at 50° C. overnight. The reaction solution was poured into ice water and was neutralized with a 4 M NaOH aqueous solution. The precipitated white solid was suction-filtered, and the residue was washed with water and was dried under reduced pressure to obtain Compound (1-h) (amount: 6.04 g, yield: 68%).

Compound (1-h) (3.1 g, 10 mmol) and acetic acid (80 mL) were put in a 100-mL recovery flask, and a fine iron powder (6.5 g) was gradually added to the flask with stirring, followed by stirring at room temperature overnight. The reaction solution was poured into ice water, and the deposited precipitate was suction-filtered and was washed with water to obtain Compound (1-i) as a brown solid (amount: 1.6 g, yield: 61%).

Compound (1-i) (1.6 g, 5 mmol), triethylamine (3.5 mL), and dichloromethane (DCM, 40 mL) were put in a 100-mL two-necked flask equipped with a reflux tube, and thionyl chloride (0.9 mL, 12.7 mmol) was gradually dropwise add to the flask with ice-cooling and stirring, followed by stirring at 50° C. overnight. The reaction solution was poured into ice water and was made sufficiently acidic with concentrated HCl, followed by extraction with dichloromethane. The organic layer was dried over sodium sulfate and was concentrated to dryness. The resulting black solid was purified by column chromatography (eluent: chloroform) to obtain Compound (1-j) as a red solid (amount: 0.5 g, yield: 28%).

(3) Synthesis of Compound 1

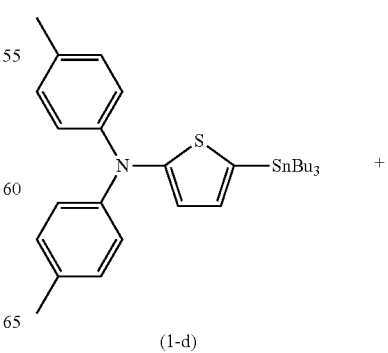

(1-d)

29

-continued

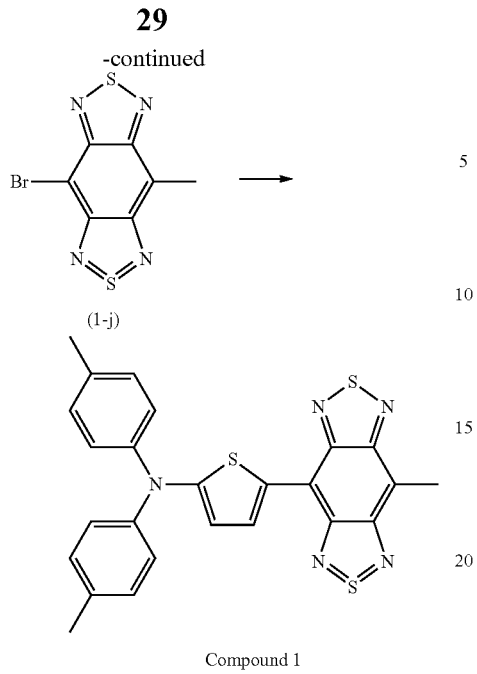

(1-j)

Compound 1

Compound (1-d) (113 mg, 0.14 mmol), Compound (1-j) (40 mg, 0.14 mmol), Pd$_2$(dba)$_3$CHCl$_3$ (3 mg, 2 mol %), XPhos (3 mg, 4 mol %), CsF (60 mg, 0.4 mmol), and toluene (5 mL) were put in a reaction test tube equipped with a screw cap and were freeze-deaerated. An argon gas atmosphere was made inside the reaction vessel, and the mixture was then stirred with heating at 120° C. overnight. The reaction solution was cooled to room temperature and was filtered through celite, and the filtrate was concentrated to dryness. The residue was purified by silica gel column chromatography (eluent: dichloromethane) to obtain a green solid (amount: 21 mg (0.043 mmol), yield: 30%).

The resulting compound was identified by $^1$HNMR. The results are as follows:

$^1$HNMR (500 MHz, CDCl$_3$): δ (ppm)=8.77 (1H), 6.65 (1H), 7.21 (4H), 7.15 (4H), 3.18 (3H), 2.36 (6H).

Since the target compound has a chemical formula of C$_{25}$H$_{19}$N$_5$S$_3$, it was verified that the target compound, Compound 1, was obtained by the synthesis procedure described above.

Example 2

Synthesis of Compound 10

Compound 10 represented by the following structural formula was synthesized according to steps (1) to (3) described below. Compound 10 has an A-D-A structure.

Compound 10

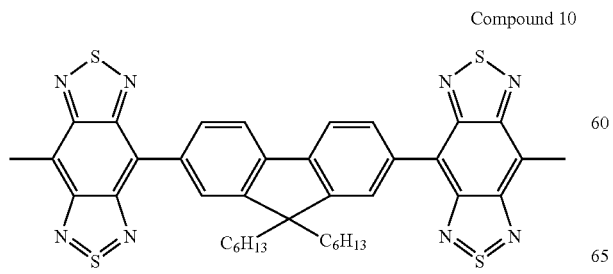

30

(1) Synthesis of Compound (2-b)

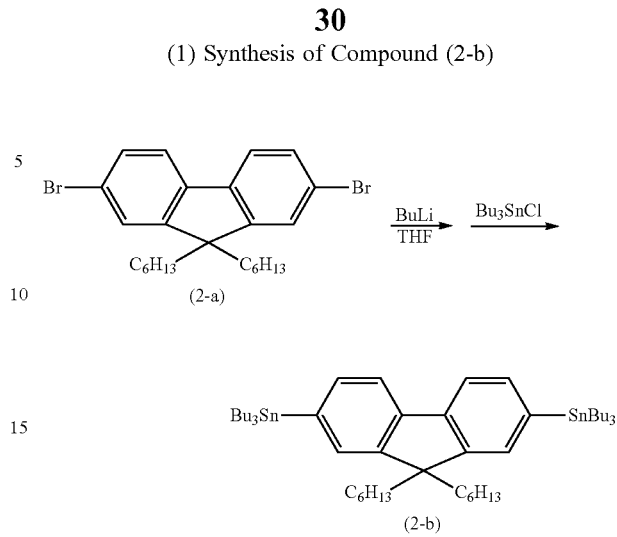

An anhydrous THF solution (200 mL) of Compound (2-a) (7.38 g, 14.99 mmol) was put in a 500-mL two-necked flask in an argon gas atmosphere and was cooled to −65° C. to −70° C. A BuLi solution (17 mL, 45 mmol) was dropwise added to the flask with stirring, followed by stirring at −65° C. to −70° C. for 1.5 hours. Subsequently, Bu$_3$SnCl (14.0 g, 43 mmol) was dropwise added to the flask, followed by stirring for 1 hour. The cooling bath was then removed, followed by stirring overnight. Ethyl acetate was added to the flask, followed by quenching. The reaction solution was then concentrated to obtain a crude product. The resulting crude product was purified by a column chromatography using silica gel adjusted to basic to obtain Compound (2-b) (amount: 8.85 g, yield: 62.5%).

(2) Synthesis of Compound (1-j)

Compound (1-j) was prepared as in step (2) of Example 1.

(2) Synthesis of Compound 10

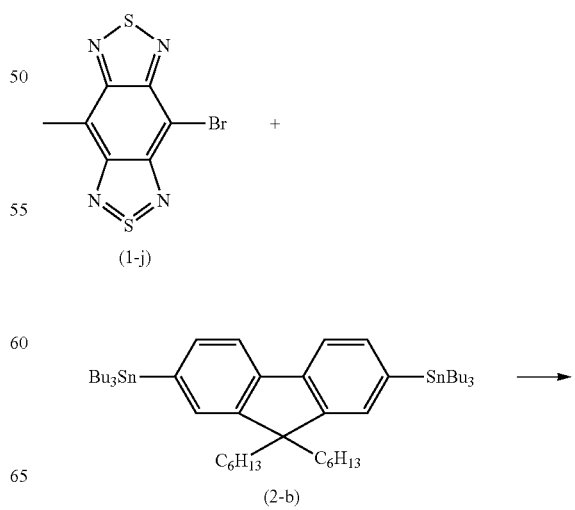

-continued

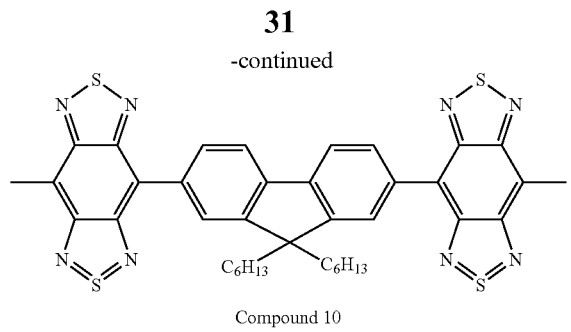

Compound 10

Compound (1-j) (158 mg, 0.5 mmol), Compound (2-b) (228 mg, 0.25 mmol), and a toluene solution (40 mL) of bis(triphenylphosphine)palladium(II) dichloride (PdCl$_2$(PPh$_3$)$_2$, 30 mg) were put in a reaction test tube equipped with a screw cap in an argon gas atmosphere and were stirred with heating at 110° C. for 48 hours. The reaction solution was cooled to room temperature and was suction-filtered to remove insoluble matter. The filtrate was concentrated under reduced pressure to obtain a crude product. The resulting crude product was dissolved in hexane by heating. The resulting lysate was purified by silica gel chromatography. The resulting fraction solution was cooled, and the precipitated insoluble matter was collected by filtration to obtain Compound 10 (amount: 50 mg, yield: 24%).

The compound was identified by $^1$HNMR. The results are as follows:

$^1$HNMR (500 MHz, CDCl$_3$): δ (ppm)=8.32 (2H), 8.28 (2H), 8.04 (2H), 3.35 (6H), 2.13-2.16 (26H).

Since the target compound has a chemical formula of C$_{39}$H$_{38}$N$_8$S$_4$, it was judged that the target compound was obtained.

Example 3

Synthesis of Compound 17

Compound 17 represented by the following structural formula was synthesized according to steps (1) to (3) described below. Compound 17 has an A-D-A structure.

Compound 17

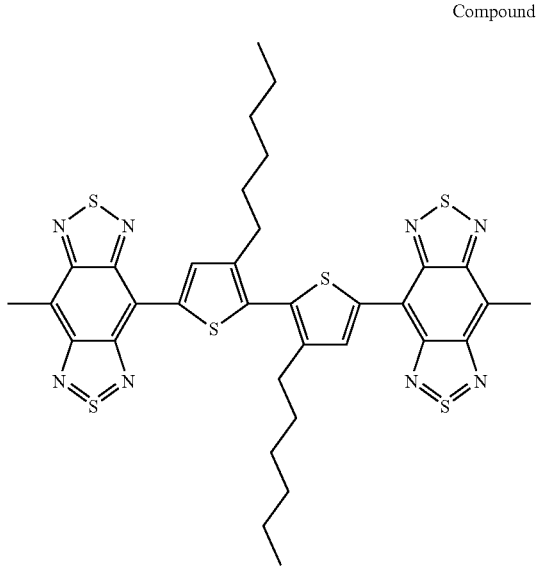

(1) Synthesis of Compound (3-b)

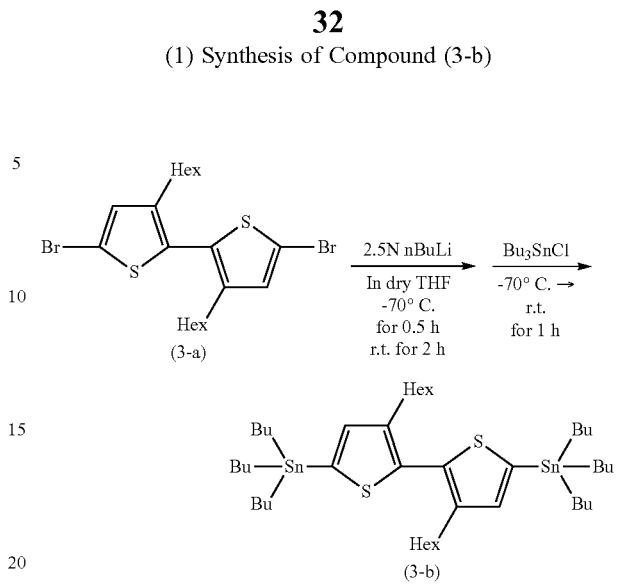

An anhydrous THF solution (45 mL) of Compound (3-a) (2.0 g, 4.1 mmol) was put in a 200-mL two-necked flask in an argon gas atmosphere and was cooled to −70° C. A BuLi solution (3.9 mL, 9.75 mmol) was dropwise added to the flask with stirring, followed by stirring at −70° C. for 0.5 hours. The reaction solution was warmed to room temperature, followed by stirring for 2 hours. Subsequently, the solution was cooled to −70° C. again, and Bu$_3$SnCl (3 g, 9.2 mmol) was dropwise added to the flask, followed by warming to room temperature and then stirring for 1 hour. Ethyl acetate was added to the flask, followed by quenching. The reaction solution was then concentrated and was filtered to obtain a crude product containing Compound (3-b) (amount: 4.76 g).

(2) Synthesis of Compound (1-j)

Compound (1-j) was prepared as in step (2) of Example 1.

(3) Synthesis of Compound 17

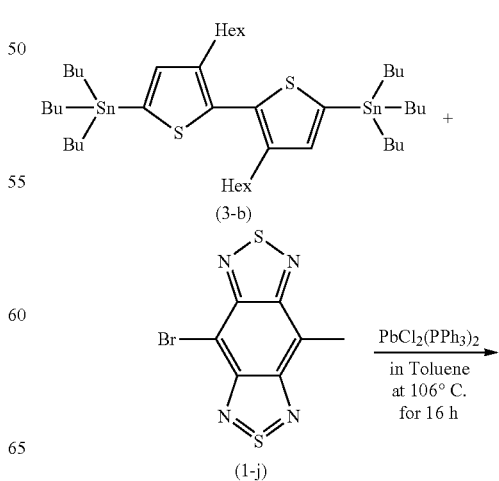

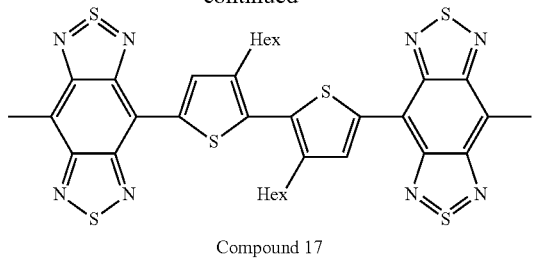

Compound 17

Compound (1-j) (1.2 g, 4.1 mmol), Compound (3-b) (1.5 g, 1.6 mmol), and a toluene solution (30 mL) of bis(triphenylphosphine)palladium(II) dichloride (PdCl$_2$(PPh$_3$)$_2$, 0.57 g) were put in a 200-mL three-necked flask in an argon gas atmosphere and were stirred with heating at 106° C. for 16 hours. The reaction solution was cooled to room temperature and was suction-filtered to remove insoluble matter. The filtrate was concentrated under reduced pressure to obtain a crude product. The resulting crude product was dissolved in a mixture of toluene and heptane (1:1) by heating. The resulting lysate was purified by silica gel chromatography. The resulting fraction solution was cooled, and the precipitated insoluble matter was collected by filtration as Compound 17 (amount: 8 mg, yield: 6%).

The compound was identified by $^1$HNMR. The results are as follows:

$^1$HNMR (400 MHz, C$_6$D$_6$): δ (ppm)=9.34 (2H), 3.06-0.78 (32H).

Since the target compound has a chemical formula of C$_{34}$H$_{34}$N$_8$S$_6$, it was judged that the target compound, Compound 17, was obtained.

Comparative Example 1

As a comparative example, Comparative Compound 1 represented by the following structural formula was synthesized. Comparative Compound 1 has a D-A-D structure. The synthesis was performed in accordance with the method described in Advanced Materials, Vol. 21, pp. 111-116.

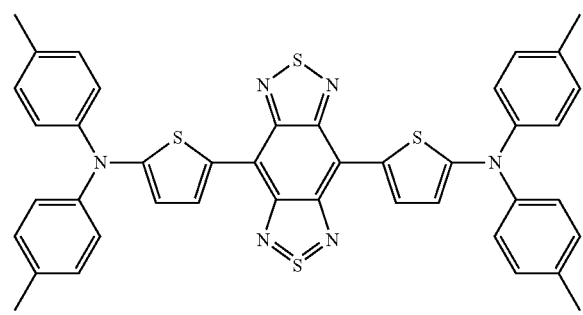

Comparative Compound 1

The results of mass spectrometry showed an m/z signal of 749.18. Since the target compound has a chemical formula of C$_{42}$H$_{32}$N$_6$S$_4$ and has a molecular weight of 749, it was judged that the target compound was obtained.

Example 4

A photoelectric conversion material containing Compound 1 prepared in Example 1 was spin-coated on a support substrate of quartz glass having a thickness of 0.7 mm to form a photoelectric conversion film having a thickness of 40 nm and an ionization potential of 5.3 eV. The absorption spectrum of the resulting photoelectric conversion film was measured with a spectrophotometer (U4100, manufactured by Hitachi High-Technologies Corporation) in a wavelength range of 400 to 1200 nm. The results are shown in FIG. 3.

Figure 3:
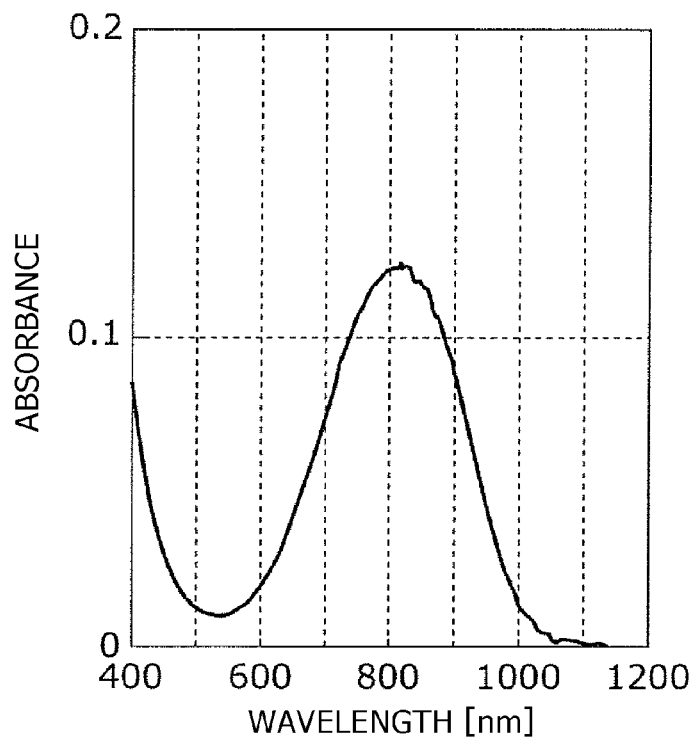
FIG. 3 shows an absorption spectrum according to Example 4.

As shown in FIG. 3, the photoelectric conversion film of Example 4 had an absorption peak at about 820 nm and an absorbance peak of 0.12.

A film of Compound 1 prepared in Example 1 was formed on an ITO substrate, and the ionization potential was measured with an atmospheric photoelectron spectrometer (AC-3, manufactured by Kiken Keiki Co., Ltd.).

Example 5

Figure 4:
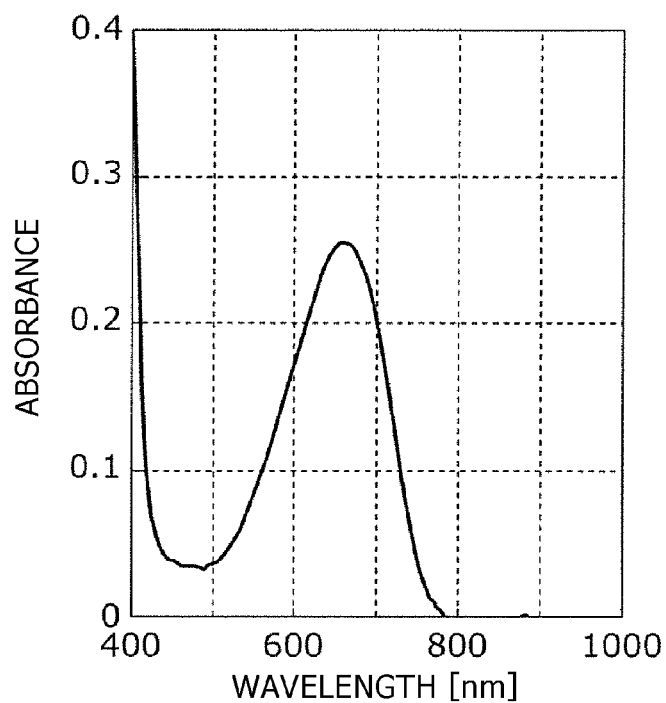
FIG. 4 shows an absorption spectrum according to Example 5.

A photoelectric conversion material containing Compound 10 prepared in Example 2 was spin-coated on a support substrate of quartz glass having a thickness of 0.7 mm to form a photoelectric conversion film having a thickness of 40 nm and an ionization potential of 6.0 eV. As shown in FIG. 4, the photoelectric conversion film of Example 5 had an absorption peak at about 670 nm and an absorbance peak of 0.26.

The ionization potential was measured as in Example 4 except that Compound 10 prepared in Example 2 was used.

Example 6

Figure 5:
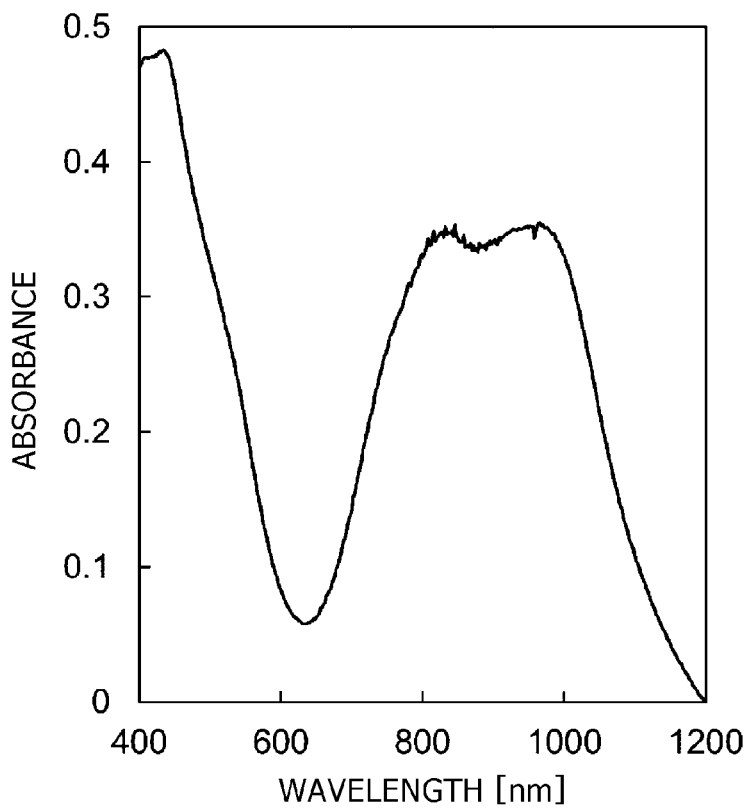
FIG. 5 shows an absorption spectrum according to Example 6.

A photoelectric conversion material containing Compound 17 prepared in Example 3 was spin-coated on a support substrate of quartz glass having a thickness of 0.7 mm to form a photoelectric conversion film having a thickness of 40 nm and an ionization potential of 5.4 eV. As shown in FIG. 5, the photoelectric conversion film of Example 6 had absorption peaks at about 840 nm and about 960 nm and absorbance peaks of 0.34 and 0.35, respectively.

The ionization potential was measured as in Example 4 except that Compound 17 prepared in Example 3 was used.

Comparative Example 2

Compared Compound 1 prepared in Comparative Example 1 was spin-coated on a support substrate of quartz glass having a thickness of 0.7 mm to form a photoelectric conversion film having a thickness of 45 nm and an ionization potential of 5.1 eV. The absorption spectrum of the resulting photoelectric conversion film was measured as in Example 4. The results are shown in FIG. 6.

Figure 6:
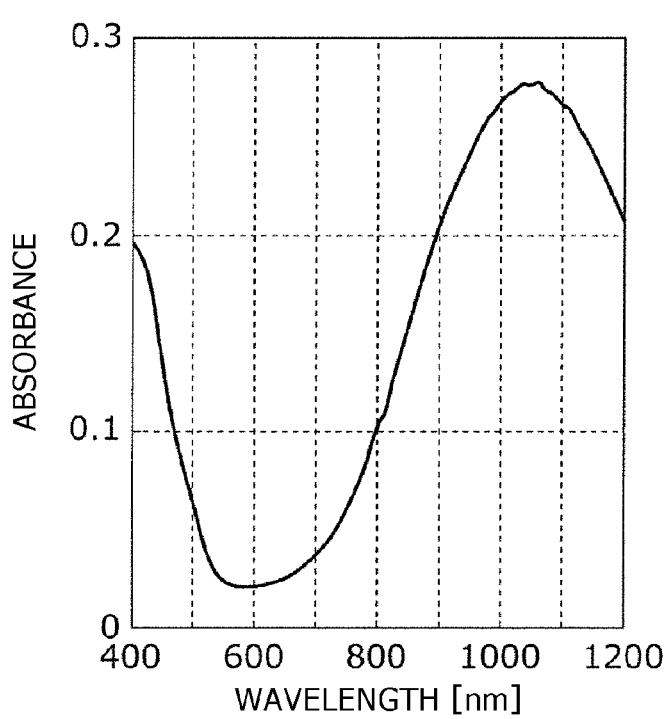
FIG. 6 shows an absorption spectrum according to Comparative Example 2.

As shown in FIG. 6, the photoelectric conversion film of Comparative Example 2 had an absorption peak at about 1050 nm and an absorbance peak of 0.27.

The ionization potential was measured as in Example 4 except that Comparative Compound 1 prepared in Comparative Example 1 was used.

Conclusion

As described above, the photoelectric conversion films of Examples 4 to 6 and Comparative Example 2 were evaluated for the near-infrared light-absorption properties and the ionization potential.

Near-Infrared Light-Absorption Properties

Regarding the near-infrared light-absorption properties, the photoelectric conversion film of Example 4 had an absorption peak at about 820 nm; the photoelectric conversion film of Example 5 had an absorption peak at about 670 nm and an absorption edge at 775 nm; the photoelectric conversion film of Example 6 had absorption peaks at about 840 nm and about 960 nm and an absorption edge of 1200 nm. The photoelectric conversion film of Comparative Example 2 had an absorption peak at about 1050 nm. Thus, the photoelectric conversion films of Examples 4 to 6 and Comparative Example 2 each had an absorption wavelength in the near infrared region of 750 nm or more.

It was thus verified that a photoelectric conversion film having high light-absorption properties in the near infrared region can be provided by using a photoelectric conversion material containing a compound having a benzo[1,2-c:4,5-c']bis[1,2,5]thiadiazole skeleton. The results in Examples 4 to 6 demonstrated that the photoelectric conversion material according to the embodiment has absorption in the near infrared region in the solid state.

Ionization Potential

The photoelectric conversion film of Example 4 had an ionization potential of 5.3 eV. The photoelectric conversion film of Example 5 had an ionization potential of 6.0 eV. The photoelectric conversion film of Example 6 had an ionization potential of 5.4 eV. The results verified that the photoelectric conversion material according to the embodiment had an ionization potential of higher than 5.2 eV in the solid state.

In contrast, the photoelectric conversion film of Comparative Example 2 had an ionization potential of 5.1 eV, i.e., lower than 5.2 eV.

The results demonstrated that the photoelectric conversion films of Examples 4 to 6 had HOMO energy levels lower than that of the photoelectric conversion film of Comparative Example 2. The HOMO energy level is thus lowered, probably because of the difference in the structure of the compounds as described above.

The photoelectric conversion material used in Example 4 contains Compound 1 prepared in Example 1. Compound 1 has a D-A structure. The photoelectric conversion material used in Example 5 contains Compound 10 prepared in Example 2. The Compound 10 has an A-D-A structure. The photoelectric conversion material used in Example 6 contains Compound 17 prepared in Example 3. Compound 17 has an A-D-A structure. These compounds have structures reducing the influence of the donor unit (D).

In contrast, the photoelectric conversion material used in Comparative Example 2 contains Comparative Compound 1 prepared in Comparative Example 1. Comparative Compound 1 has a D-A-D structure.

Accordingly, it was demonstrated that compounds having a D-A structure or an A-D-A structure reduce the influence of donor units (D) to lower the HOMO energy level compared to compounds having a D-A-D structure.

Specific compounds included in the concept of the present disclosure will now be exemplified. The HOMO energy levels and the LUMO energy levels of these compounds were calculated by Gaussian (DFT method using B3LYP, basis function: 6-21G*). The results are shown in Tables 1 to 3.

The HOMO energy levels and LUMO energy levels of Compound 1, Compound 10, Compound 17, and Comparative Compound 1 actually measured in Example 1, Example 2, Example 3, and Comparative Example 1 are also shown.

TABLE 1

| | Structure | Name | Structural Formula | Calculated Value (eV) | | | Measured Value (eV) | |
|---|---|---|---|---|---|---|---|---|
| | | | | HOMO | LUMO | HOMO-LUMO | HOMO | LUMO |
| Comparative Example 1 | D-A-D | Comparative Compound 1 | | 4.04 | 3.28 | 0.76 | 5.10 | 3.90 |
| Example 1 | D-A | Compound 1 | | 4.56 | 3.40 | 1.16 | 5.30 | 3.70 |

TABLE 1-continued

| | Structure | Name | Structural Formula | Calculated Value (eV) | | | Measured Value (eV) | |
|---|---|---|---|---|---|---|---|---|
| | | | | HOMO | LUMO | HOMO-LUMO | HOMO | LUMO |
| Example 1-2 | D-A | Compound 2 | | 4.68 | 3.43 | 1.25 | | |
| Example 1-3 | D-A | Compound 3 | | 4.67 | 3.54 | 1.13 | | |
| Example 1-4 | D-A | Compound 4 | | 4.99 | 3.75 | 1.24 | | |
| Example 1-5 | D-A | Compound 5 | | 4.55 | 3.36 | 1.19 | | |

TABLE 1-continued

| | Structure | Name | Structural Formula | Calculated Value (eV) | | | Measured Value (eV) | |
|---|---|---|---|---|---|---|---|---|
| | | | | HOMO | LUMO | HOMO-LUMO | HOMO | LUMO |
| Example 1-6 | D-A | Compound 6 | | 4.88 | 3.63 | 1.25 | | |
| Example 1-7 | D-A | Compound 7 | | 4.83 | 3.61 | 1.22 | | |
| Example 1-8 | D-A | Compound 8 | | 4.76 | 3.20 | 1.56 | | |
| Example 1-9 | D-A | Compound 9 | | 5.73 | 4.52 | 1.21 | | |

TABLE 2

| Structure | Name | Structural Formula | Calculated Value (eV) | | | Measured Value (eV) | |
|---|---|---|---|---|---|---|---|
| | | | HOMO | LUMO | HOMO-LUMO | HOMO | LUMO |
| Example 2 A-D-A | Compound 10 | | 5.20 | 4.00 | 1.20 | 6.00 | 4.40 |
| Example 2-2 A-D-A | Compound 11 | | 4.84 | 4.18 | 0.66 | | |
| Example 2-3 A-D-A | Compound 12 | | 5.17 | 4.02 | 1.15 | | |

TABLE 2-continued

| Structure | | | | Calculated Value (eV) | | | Measured Value (eV) | |
| --- | --- | --- | --- | --- | --- | --- | --- | --- |
| | ture | Name | Structural Formula | HOMO | LUMO | HOMO-LUMO | HOMO | LUMO |
| Example 2-4 | A-D-A | Compound 13 | | 4.84 | 4.15 | 0.69 | | |
| Example 2-5 | A-D-A | Compound 14 | | 5.18 | 3.72 | 1.46 | | |
| Example 2-6 | A-D-A | Compound 15 | | 5.28 | 4.03 | 1.25 | | |
| Example 2-7 | A-D-A | Compound 16 | | 4.98 | 4.21 | 0.77 | | |

TABLE 3

| | Structure | Name | Structural Formula | Calculated Value (eV) | | | Measured Value (eV) | |
|---|---|---|---|---|---|---|---|---|
| | | | | HOMO | LUMO | HOMO-LUMO | HOMO | LUMO |
| Example 3 | A-D-A | Compound 17 | | 4.83 | 4.11 | 0.72 | 5.4 | 4.3 |
| Example 3-2 | A-D-A | Compound 18 | | 5.03 | 4.02 | 1.01 | | |

Compounds 1 to 9 shown in Table 1 have D-A structures, and Compounds 10 to 18 shown in Tables 2 and 3 have A-D-A structures.

Evaluation criteria of the light-absorption properties in the near infrared region of compounds were set by comparing the measured value and the calculated value of the difference between the HOMO (Highest Occupied Molecular Orbital) energy and the LUMO (Lowest Unoccupied Molecular Orbital) energy, HOMO-LUMO value, of each of the compounds. For example, the measured HOMO-LUMO value of a compound having absorption properties against light having a wavelength of 750 nm was 1.65 eV, and the HOMO-LUMO value calculated by Gaussian was 1.23 eV. For example, the measured HOMO-LUMO value of Compound 10 of Example 2 was 1.2 eV, and the calculated HOMO-LUMO value was 1.2 eV. These results suggest that a compound having a HOMO-LUMO value of slightly higher than 1.23 eV also has light-absorption properties at about 750 nm. A compound having a smaller HOMO-LUMO value has absorption properties against light having a longer wavelength.

Evaluation criteria of the energies of HOMO of compounds were set by comparing the ionization potential values of the photoelectric conversion films of Comparative Example 2 and Examples 4 to 6 and the calculated energy values of HOMO of Comparative Compound 1 and Compound 1 shown in Table 1, Compound 10 shown in Table 2, and Compound 17 shown in Table 3. The ionization potential refers to the energy of HOMO.

As shown in Table 1, the measured energy value of HOMO of Comparative Compound 1 was 5.10 eV, and the calculated energy value of HOMO was 4.04 eV. The measured energy value of HOMO of Compound 1 was 5.30 eV, and the calculated energy value of HOMO was 4.56 eV. As shown in Table 2, the measured energy value of HOMO of Compound 10 was 6.00 eV, and the calculated energy value of HOMO was 5.20 eV. As shown in Table 3, the measured energy value of HOMO of Compound 17 was 5.40 eV, and the calculated energy value of HOMO was 4.83 eV. The results suggested that if an energy value of HOMO is not lower than the median value (4.30 eV) of the calculated energy values of HOMO of Comparative Compound 1 and Compound 1, the ionization potential is higher than 5.2 eV.

Accordingly, Compounds 1 to 18 shown in Tables 1 to 3 have high light-absorption properties in the near infrared region and have an ionization potential of higher than 5.2 eV, a high energy of HOMO, in the solid state, i.e., a low HOMO energy level. These compounds have a benzo[1,2-c:4,5-c'] bis[1,2,5]thiadiazole skeleton and thereby have high absorption properties in the near infrared region. Accordingly, photoelectric conversion films formed using these compounds have high light-absorption properties in the near infrared region and can reduce dark current.

What is claimed is:

1. A photoelectric conversion element comprising:
a pair of electrodes;
a photoelectric conversion layer disposed between the pair of electrodes, wherein
the photoelectric conversion layer includes a bulk hetero layer composed of a mixture of an n-type organic semiconductor material and a photoelectric conversion material; and
the photoelectric conversion material contains a compound represented by the following first formula:

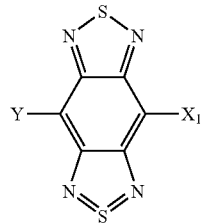

where
X is selected from the group consisting of a hydrogen atom, a deuterium atom, a halogen atom, an alkyl group, and —C≡N; and
Y represents a monovalent substituent represented by the following second formula:

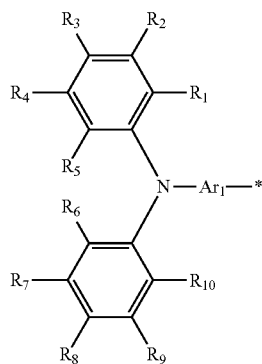

where
$R_1$, $R_2$, $R_3$, $R_4$, $R_5$, $R_6$, $R_7$, $R_8$, $R_9$, and $R_{10}$ each independently represent a hydrogen atom, a deuterium atom, a halogen atom, an alkyl group, or an aryl group; or two or more of $R_1$, $R_2$, $R_3$, $R_4$, $R_5$, $R_6$, $R_7$, $R_8$, $R_9$, and $R_{10}$ bond to each other to form one or more rings, and the remainders each independently represent a hydrogen atom, a deuterium atom, a halogen atom, an alkyl group, or an aryl group;
* denotes a binding site of Y in the first formula; and
$Ar_1$ is selected from the group consisting of structures represented by the following third formulae:

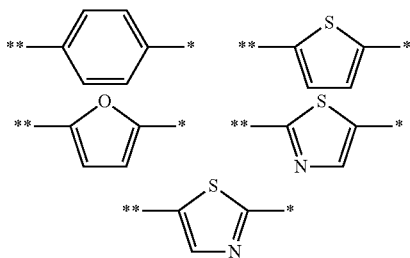

where
* denotes the binding site of Y in the first formula; and
** denotes a binding site of $Ar_1$ with N in the second formula.

2. The photoelectric conversion element according to claim 1, wherein
the n-type organic semiconductor material contains at least one selected from the group consisting of fullerene and a fullerene derivative.

* * * * *